United States Patent
Shimada et al.

(10) Patent No.: US 11,064,143 B2
(45) Date of Patent: Jul. 13, 2021

(54) IMAGE PROCESSING DEVICE AND IMAGE PICKUP APPARATUS FOR PROCESSING DIVISIONAL PIXAL SIGNALS TO GENERATE DIVISIONAL IMAGE DATA

(71) Applicant: Olympus Corporation, Hachioji (JP)

(72) Inventors: Yoshinao Shimada, Hino (JP); Yoshinobu Tanaka, Hachioji (JP)

(73) Assignee: Olympus Corporation, Tokyo (JP)

( * ) Notice: Subject to any disclaimer, the term of this patent is extended or adjusted under 35 U.S.C. 154(b) by 124 days.

(21) Appl. No.: 16/576,435

(22) Filed: Sep. 19, 2019

(65) Prior Publication Data
US 2020/0099876 A1 Mar. 26, 2020

(30) Foreign Application Priority Data
Sep. 25, 2018 (JP) .............................. JP2018-179321

(51) Int. Cl.
*H04N 5/335* (2011.01)
*H04N 5/369* (2011.01)
*H01L 27/146* (2006.01)
*H04N 5/374* (2011.01)

(52) U.S. Cl.
CPC ..... *H04N 5/3696* (2013.01); *H01L 27/14621* (2013.01); *H01L 27/14627* (2013.01); *H01L 27/14645* (2013.01); *H04N 5/374* (2013.01)

(58) Field of Classification Search
CPC .................................................. H04N 5/36961
See application file for complete search history.

(56) References Cited

U.S. PATENT DOCUMENTS

| | | | | |
|---|---|---|---|---|
| 9,818,781 | B2* | 11/2017 | Lee | H04N 5/3696 |
| 10,440,301 | B2* | 10/2019 | Li | H04N 5/378 |
| 10,757,348 | B2* | 8/2020 | Hatakeyama | H04N 5/36961 |
| 2012/0268613 | A1* | 10/2012 | Nishio | H04N 5/232122 |
| | | | | 348/208.5 |
| 2014/0022401 | A1* | 1/2014 | Awatani | H04N 5/335 |
| | | | | 348/207.11 |
| 2018/0160067 | A1* | 6/2018 | Sakioka | H01L 27/14607 |

* cited by examiner

*Primary Examiner* — Gary C Vieaux
(74) *Attorney, Agent, or Firm* — John C. Pokotylo; Pokotylo Patent Services

(57) ABSTRACT

An image processing device includes an image data generation circuit configured to generate n pieces of Bayer-type divisional image data configured by divisional pixel signals having the same divisional arrangement from divisional pixel signals of m×n generated by photoelectric conversion elements at n parts into which each of m pixels is divided, and an image processing circuit configured to perform image processing on the n pieces of Bayer-type divisional image data.

17 Claims, 19 Drawing Sheets

FIG. 7

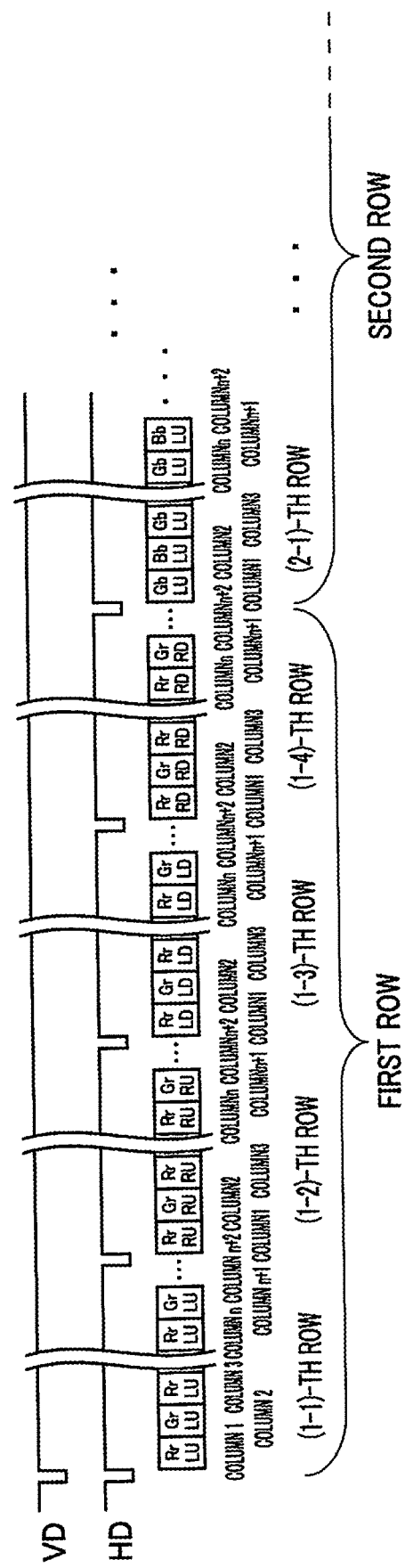

FIG. 9

| | | First col | Second col | Third col | Fourth col | ... | (Last-3) | (Last-2) | (Last-1) | Last |
|---|---|---|---|---|---|---|---|---|---|---|
| FIRST ROW | LU | Rr | Gr | Rr | Gr | | Rr | Gr | Rr | Gr |
| | LU+RU | Rr | Gr | Rr | Gr | | Rr | Gr | Rr | Gr |
| | LU+RU+LD | Rr | Gr | Rr | Gr | | Rr | Gr | Rr | Gr |
| | LU+RU+LD+RD | Rr | Gr | Rr | Gr | | Rr | Gr | Rr | Gr |
| SECOND ROW | LU | Gb | Bb | Gb | Bb | | Gb | Bb | Gb | Bb |
| | LU+RU | Gb | Bb | Gb | Bb | | Gb | Bb | Gb | Bb |
| | LU+RU+LD | Gb | Bb | Gb | Bb | | Gb | Bb | Gb | Bb |
| | LU+RU+LD+RD | Gb | Bb | Gb | Bb | | Gb | Bb | Gb | Bb |
| (LAST-1)-TH ROW | LU | Rr | Gr | Rr | Gr | | Rr | Gr | Rr | Gr |
| | LU+RU | Rr | Gr | Rr | Gr | | Rr | Gr | Rr | Gr |
| | LU+RU+LD | Rr | Gr | Rr | Gr | | Rr | Gr | Rr | Gr |
| | LU+RU+LD+RD | Rr | Gr | Rr | Gr | | Rr | Gr | Rr | Gr |
| LAST ROW | LU | Gb | Bb | Gb | Bb | | Gb | Bb | Gb | Bb |
| | LU+RU | Gb | Bb | Gb | Bb | | Gb | Bb | Gb | Bb |
| | LU+RU+LD | Gb | Bb | Gb | Bb | | Gb | Bb | Gb | Bb |
| | LU+RU+LD+RD | Gb | Bb | Gb | Bb | | Gb | Bb | Gb | Bb |

FIG. 10

| | | First col | Second col | Third col | Fourth col | (Last-3)-th | (Last-2)-th | (Last-1)-th | Last col |
|---|---|---|---|---|---|---|---|---|---|
| FIRST ROW | L | Rr | Gr | Rr | Gr | Rr | Gr | Rr | Gr |
| | R | Rr | Gr | Rr | Gr | Rr | Gr | Rr | Gr |
| SECOND ROW | L | Gb | Bb | Gb | Bb | Gb | Bb | Gb | Bb |
| | R | Gb | Bb | Gb | Bb | Gb | Bb | Gb | Bb |
| (LAST-1)-TH ROW | L | Rr | Gr | Rr | Gr | Rr | Gr | Rr | Gr |
| | R | Rr | Gr | Rr | Gr | Rr | Gr | Rr | Gr |
| LAST ROW | L | Gb | Bb | Gb | Bb | Gb | Bb | Gb | Bb |
| | R | Gb | Bb | Gb | Bb | Gb | Bb | Gb | Bb |

FIG. 12

|  | | col1 | col2 | col3 | col4 | col5 | col6 | col7 | col8 |
|---|---|---|---|---|---|---|---|---|---|
| FIRST ROW | L | Rr | Gr | Rr | Gr | Rr | Gr | Rr | Gr |
|  | L+R | Rr | Gr | Rr | Gr | Rr | Gr | Rr | Gr |
| SECOND ROW | L | Gb | Bb | Gb | Bb | Gb | Bb | Gb | Bb |
|  | L+R | Gb | Bb | Gb | Bb | Gb | Bb | Gb | Bb |
| (LAST-1)-TH ROW | L | Rr | Gr | Rr | Gr | Rr | Gr | Rr | Gr |
|  | L+R | Rr | Gr | Rr | Gr | Rr | Gr | Rr | Gr |
| LAST ROW | L | Gb | Bb | Gb | Bb | Gb | Bb | Gb | Bb |
|  | L+R | Gb | Bb | Gb | Bb | Gb | Bb | Gb | Bb |

Columns: FIRST COLUMN, SECOND COLUMN, THIRD COLUMN, FOURTH COLUMN, (LAST-3)-TH COLUMN, (LAST-2)-TH COLUMN, (LAST-1)-TH COLUMN, LAST COLUMN

FIG. 13

| RLUD DIVISION | IMAGE STORED IN MEMORY |
|---|---|
| LU BAYER IMAGE | Bayer pattern grid showing FIRST ROW (R ROW), SECOND ROW (B ROW), (LAST-1)-TH ROW (R ROW), LAST ROW (B ROW) with cells Rr/Gr/Gb/Bb all labeled LU across FIRST, SECOND, THIRD, FOURTH, (LAST-3)-TH, (LAST-2)-TH, (LAST-1)-TH, LAST COLUMNS |
| RU BAYER IMAGE | Bayer pattern grid with same row/column structure, cells labeled RU |
| LD BAYER IMAGE | Bayer pattern grid with same row/column structure, cells labeled LD (with one cell showing LU) |
| RD BAYER IMAGE | Bayer pattern grid with same row/column structure, cells labeled RD |

FIG. 14

| RL DIVISION | IMAGE STORED IN MEMORY |
|---|---|
| L BAYER IMAGE | <table row showing first row R ROW: Rr L, Gr L, Rr L, Gr L, Rr L, Gr L, Rr L, Gr L; second row B ROW: Gb L, Bb L, Gb L, Bb L, Gb L, Bb L, Gb L, Bb L; (LAST-1)-TH ROW R ROW: Rr L, Gr L, Rr L, Gr L, Rr L, Gr L, Rr L, Gr L; LAST ROW B ROW: Gb L, Bb L, Gb L, Bb L, Gb L, Bb L, Gb L, Bb L; columns labeled FIRST, SECOND, THIRD, FOURTH, (LAST-3)-TH, (LAST-2)-TH, (LAST-1)-TH, LAST> |
| R BAYER IMAGE | <table row showing first row R ROW: Rr R, Gr R, Rr R, Gr R, Rr R, Gr R, Rr R, Gr R; second row B ROW: Gb R, Bb R, Gb R, Bb R, Gb R, Bb R, Gb R, Bb R; (LAST-1)-TH ROW R ROW: Rr R, Gr R, Rr R, Gr R, Rr R, Gr R, Rr R, Gr R; LAST ROW B ROW: Gb R, Bb R, Gb R, Bb R, Gb R, Bb R, Gb R, Bb R; columns labeled FIRST, SECOND, THIRD, FOURTH, (LAST-3)-TH, (LAST-2)-TH, (LAST-1)-TH, LAST> |

FIG. 15

| UD DIVISION | IMAGE STORED IN MEMORY |
|---|---|
| U BAYER IMAGE | FIRST ROW R ROW: Rr U \| Gr U \| Rr U \| Gr U \| Rr U \| Gr U \| Rr U \| Gr U<br>SECOND ROW B ROW: Gb U \| Bb U \| Gb U \| Bb U \| Gb U \| Bb U \| Gb U \| Bb U<br>(LAST-1)-TH ROW R ROW: Rr U \| Gr U \| Rr U \| Gr U \| Rr U \| Gr U \| Rr U \| Gr U<br>LAST ROW B ROW: Gb U \| Bb U \| Gb U \| Bb U \| Gb U \| Bb U \| Gb U \| Bb U<br>FIRST COLUMN, SECOND COLUMN, THIRD COLUMN, FOURTH COLUMN, (LAST-3)-TH COLUMN, (LAST-2)-TH COLUMN, (LAST-1)-TH COLUMN, LAST COLUMN |
| D BAYER IMAGE | FIRST ROW R ROW: Rr D \| Gr D \| Rr D \| Gr D \| Rr D \| Gr D \| Rr D \| Gr D<br>SECOND ROW B ROW: Gb D \| Bb D \| Gb D \| Bb D \| Gb D \| Bb D \| Gb D \| Bb D<br>(LAST-1)-TH ROW R ROW: Rr D \| Gr D \| Rr D \| Gr D \| Rr D \| Gr D \| Rr D \| Gr D<br>LAST ROW B ROW: Gb D \| Bb D \| Gb D \| Bb D \| Gb D \| Bb D \| Gb D \| Bb D<br>FIRST COLUMN, SECOND COLUMN, THIRD COLUMN, FOURTH COLUMN, (LAST-3)-TH COLUMN, (LAST-2)-TH COLUMN, (LAST-1)-TH COLUMN, LAST COLUMN |

FIG. 16

IMAGE PROCESSING DEVICE AND IMAGE PICKUP APPARATUS FOR PROCESSING DIVISIONAL PIXAL SIGNALS TO GENERATE DIVISIONAL IMAGE DATA

CROSS REFERENCE TO RELATED APPLICATION

This application claims benefit of Japanese Application No. 2018-179321 filed in Japan on Sep. 25, 2018, the entire contents of which are incorporated herein by this reference.

BACKGROUND OF THE INVENTION

1. Field of the Invention

The present invention relates to an image processing device configured to process a plurality of divisional pixel signals generated by a plurality of photoelectric conversion elements provided in one pixel, and an image pickup apparatus.

2. Description of the Related Art

An image sensor in which a plurality of photoelectric conversion units (photoelectric conversion elements) are provided to one pixel has been proposed. Light beams obtained by dividing the pupil of a photographing optical system are incident onto the plurality of photoelectric conversion units in the pixel. Therefore, a plurality of divisional pixel signals outputted from a plurality of photoelectric conversion units within one pixel contain phase difference information. Therefore, a technique has conventionally been proposed which detects a phase difference based on a plurality of divisional pixel signals and performs autofocus (AF) of a phase difference detection method. Such AF is called image plane phase difference AF.

Furthermore, a normal pixel signal can be generated by adding a plurality of divisional pixel signals corresponding to one pixel. Therefore, it has been conventionally implemented to record a RAW image configured by ordinary pixel signals as a RAW image file or perform image processing on a RAW image and record the processed RAW image as a JPEG image file.

SUMMARY OF THE INVENTION

According to an aspect of the present invention, an image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more, is configured to process divisional pixel signals of m×n generated by the photoelectric conversion elements of m×n, and comprises: an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data.

An image pickup apparatus according to an aspect of the present invention comprises: an image sensor including color filters of m in which a plurality of filter colors are arranged in a Bayer layout, wherein m represents an integer of 4 or more, microlenses of m each of which is provided so as to correspond to each of the color filters of m, photoelectric conversion elements of m×n that include photoelectric conversion elements of m sets each of which is provided so as to correspond to each of the microlenses of m so that a pixel including one color filter and one microlens further includes a set comprising photoelectric conversion elements of n, and generate divisional pixel signals of m×n respectively, wherein n represents an integer of 2 or more, and an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data outputted from the image sensor.

BRIEF DESCRIPTION OF THE DRAWINGS

FIG. 7 is a diagram showing an example of rearranged image data generated by a rearrangement circuit in the case of 4-division pixels in the first embodiment;

FIG. 8 is a timing chart showing a state in which rearranged image data are sequentially outputted from the rearrangement circuit in the case of 4-division pixels in the first embodiment;

FIG. 9 is a diagram showing another example of rearranged image data generated by performing rearrangement by the rearrangement circuit as necessary according to an output format from the image sensor in the first embodiment;

FIG. 10 is a diagram showing an example of rearranged image data generated by the rearrangement circuit in the case of RL 2-division pixels in the first embodiment;

FIG. 12 is a diagram showing another example of rearranged image data generated by performing rearrangement by the rearrangement circuit as necessary according to the output format from the image sensor in the first embodiment;

FIG. 13 is a chart showing an example in the case of rearranged image data inputted in an order as shown in FIG. 7 of four pieces of Bayer-type divisional image data configured by divisional pixel signals having the same divisional arrangement which are obtained by separating rearranged image data by a Bayer separation circuit in the case of 4-division pixels in the first embodiment;

FIG. 14 is a chart showing an example of two pieces of Bayer-type divisional image data configured by divisional pixel signals having the same divisional arrangement which are obtained by separating rearranged image data by the Bayer separation circuit in the case of RL 2-division pixels in the first embodiment;

FIG. 15 is a chart showing an example of two pieces of Bayer-type divisional image data configured by divisional pixel signals having the same divisional arrangement which are obtained by separating rearranged image data by the Bayer separation circuit in the case of UD 2-division pixels in the first embodiment;

FIG. 16 is a diagram showing a method of generating correction data for low-light shading correction by interpolation in the first embodiment;

DETAILED DESCRIPTION OF THE PREFERRED EMBODIMENT(S)

An embodiment according to the present invention will be described hereunder with reference to the drawings.

First Embodiment

Figure 1:
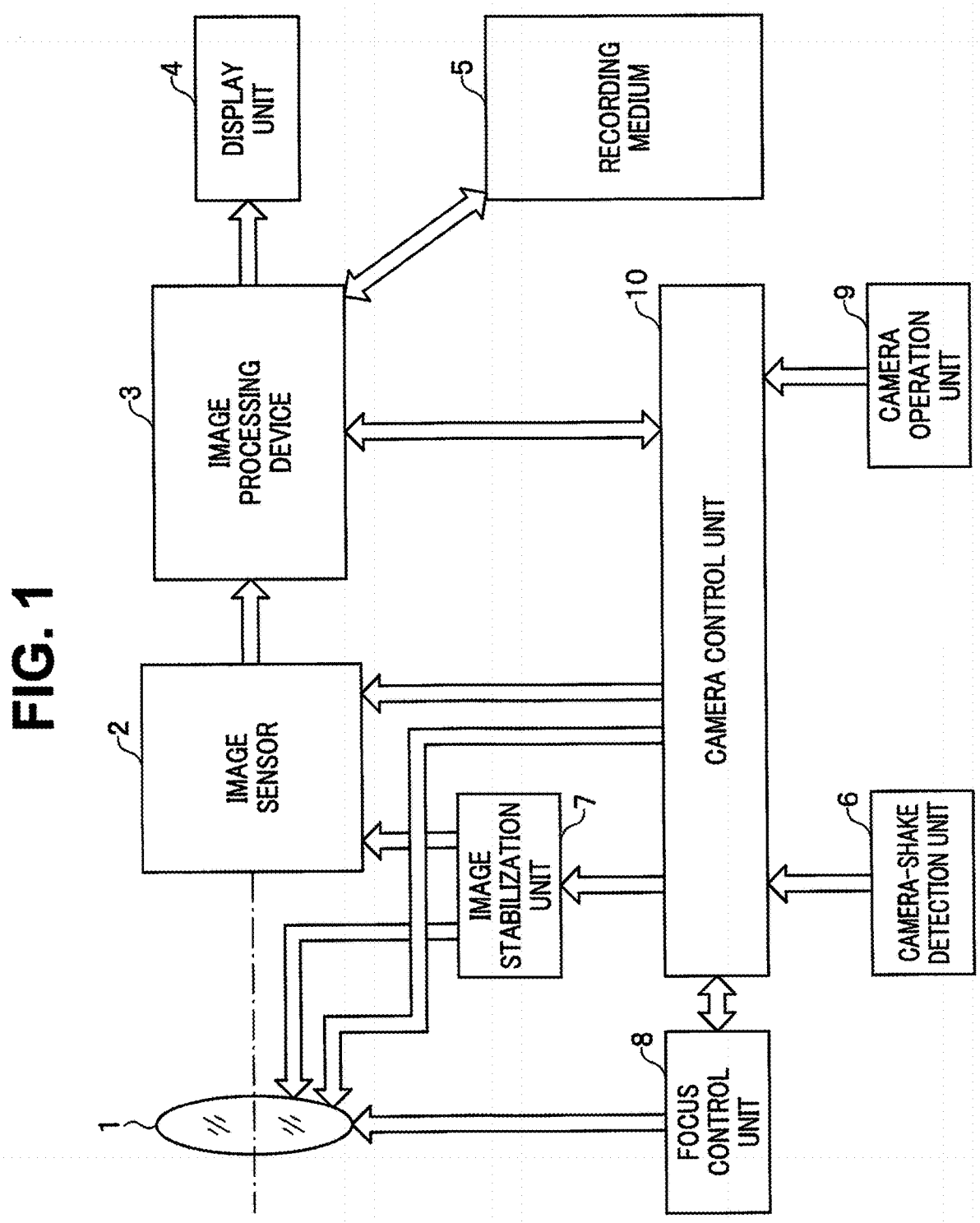
FIG. 1 is a block diagram showing a configuration of an image pickup apparatus in a first embodiment of the present invention.

FIGS. 1 to 19 show a first embodiment of the present invention, and FIG. 1 is a block diagram showing a configuration of an image pickup apparatus.

Note that although FIG. 1 shows an example in which the image pickup apparatus is configured as, for example, a digital camera, the image pickup apparatus is not limited to a digital camera, and may be various types of apparatuses having a photographing function such as a digital video camera, a telephone device with a photographing function, an electronic endoscope, a microscope with a photographing function and a telescope with a photographing function.

As shown in FIG. 1, the image pickup apparatus includes a lens 1, an image sensor 2, an image processing device 3, a display unit 4, a camera-shake detection unit 6, an image stabilization unit 7, a focus control unit 8, a camera operation unit 9, and a camera control unit 10. Note that although a recording medium 5 is also shown in FIG. 1, the recording medium 5 may not be a component inherent in the image pickup apparatus because the recording medium 5 may be configured to be attachable and detachable to and from the image pickup apparatus.

The lens 1 is an image pickup optical system that forms an optical image of an object on the image sensor 2. The lens 1 includes a focus lens for adjusting a focal position (focus position) to perform focusing, and an aperture for controlling a range of a light flux passing therethrough, and further includes an image stabilization function in the present embodiment.

Note that although not shown, it is assumed that a mechanical shutter for controlling an exposure time is further provided, for example, between the lens 1 and the image sensor 2.

The image sensor 2 photoelectrically converts the optical image of the object formed by the lens 1 and outputs the photoelectrically converted optical image as an electric signal. Note that the image sensor 2 in the present embodiment is configured to be movable within a plane perpendicular to a photographing optical axis of the lens 1, and has an image stabilization function.

Figure 3:
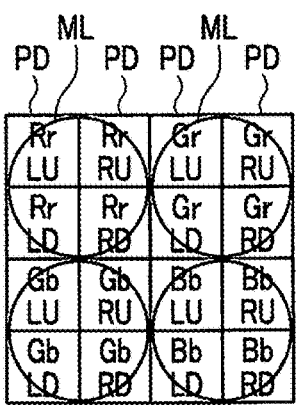
FIG. 3 is a chart showing examples of pixel divisional configurations of 4-division and 2-division and readout circuits therefor in an image sensor of the first embodiment.
Figure 6:
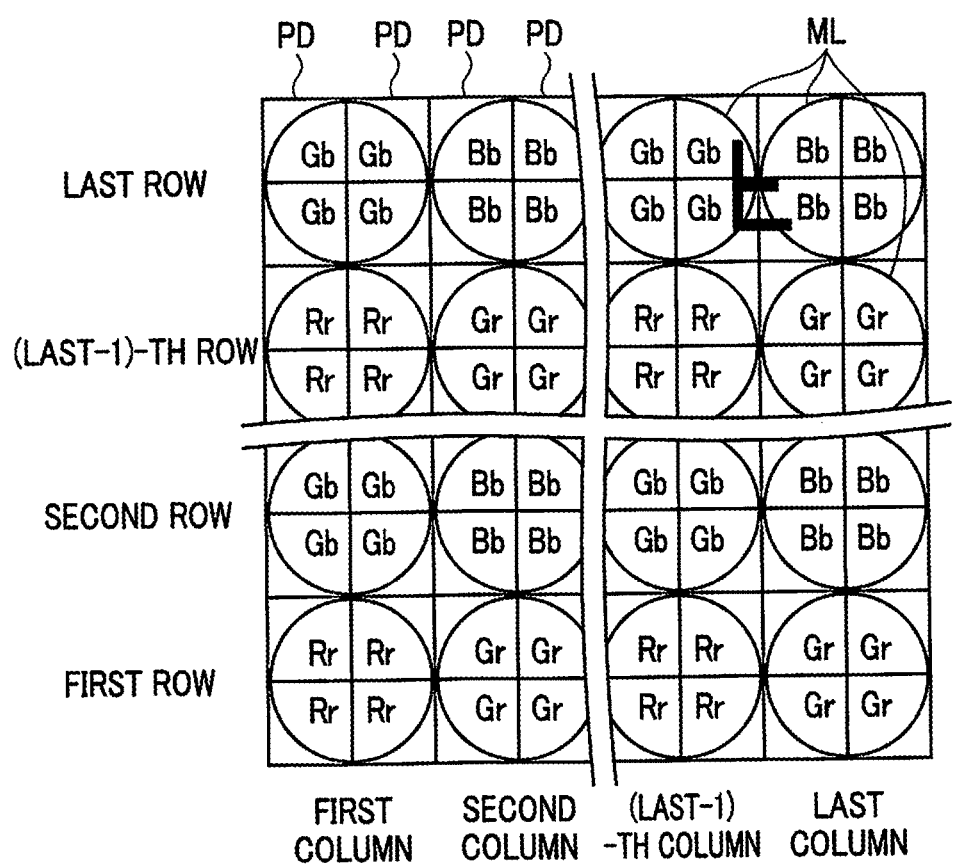
FIG. 6 is a diagram showing an example of a pixel array in the image sensor of the first embodiment.

Specifically, when m represents an integer of 4 or more and n represents an integer of 2 or more, the image sensor 2 includes color filters of m in which a plurality of filter colors are arranged in a Bayer layout, microlenses ML of m which are provided so as to correspond to the color filters of m respectively, and m sets of photoelectric conversion units PD which are provided for the microlenses ML of m respectively so that a set including the photoelectric conversion units (photoelectric conversion elements) PD of n is further included in a pixel including one color filter and one microlens ML (see FIG. 3, FIG. 6, etc.). Accordingly, m represents the number of pixels, and n represents the number of photoelectric conversion units PD included in one pixel, that is, the number of divided parts of a pixel.

Note that a general optical lens (for example, a taking lens of a camera, etc.) is not limited to a configuration in which the optical lens is configured by a single lens, and it is general to arrange a plurality of lenses in an optical axis direction to configure the optical lens. Accordingly, one microlens ML described above may also be configured by arranging a plurality of microlenses in the optical axis direction. For example, in a normal configuration, it is general to place the microlens above the color filter. On the other hand, in order to control a condensing characteristic of the microlens (the condensing property of a light flux entering the photoelectric conversion unit PD) more freely and precisely, another microlens may be further provided below the color filter. This microlens is called an inner lens. Such a microlens ML configured by two microlenses arranged in the optical axis direction with the color filter interposed therebetween is counted as one microlens ML.

Accordingly, the image sensor 2 is configured so that the pixel is divided into a plurality of divisional pixels, and is a so-called image sensor for detection of image plane phase difference.

Here, FIG. 3 is a chart showing examples of pixel divisional configurations of 4-division and 2-division, and reading circuits therefor in the image sensor 2.

In a primary color Bayer layout, vertical 2 pixels×horizontal 2 pixels are set as a basic array, and the basic array is periodically repeated in a row direction and a column direction. In a basic layout of the primary color Bayer layout, green filters Gr and Gb are arranged at diagonal positions, a red filter Rr is arranged on the same row as the green filter Gr, and a blue filter Bb is arranged on the same row as the green filter Gb.

Here, the green filter Gr and the green filter Gb have the same spectral characteristics, but are discriminated from each other according to which of the red filter Rr and the blue filter Bb is arranged on the same row. Note that in order to discriminate from R of the right (R) and left (L), red as the filter color is represented by Rr, and blue as the filter color is likewise represented by Bb.

One pixel includes a color filter of any one of the filter colors (Rr, Gr, Gb, Bb) and one microlens ML. In the case of a normal image sensor which is not for detection of image plane phase difference, the image sensor is configured so that one photoelectric conversion unit PD corresponds to one pixel. However, the image sensor 2 for detection of image plane phase difference according to the present embodiment is configured so that photoelectric conversion units PD the number n of which corresponds to the division number of the pixel are included in one pixel.

In addition, the pixels provided in the image sensor 2 include pixels each of which has a light-shielding film or the like formed thereon and is not light-shielded (effective pixels) and OB (optical black) pixels as pixels each of which has a light-shielding film or the like formed thereon and is light-shielded. An area in which the effective pixels are arranged in the image sensor 2 is called an effective area, and an area in which the OB pixels are arranged in the image sensor 2 is called an OB area. The OB areas are arranged around the effective area, and include, for example, a horizontal OB area (HOB area) arranged to be horizontally adjacent to the effective area, and a vertical OB area (VOB area) arranged to be vertically adjacent to the effective area.

A first column in FIG. 3 shows an example in which one pixel is divided into four parts of right (R), left (L), upper (U), and lower (D). Note that in FIG. 3, horizontally arranged layouts of the chart are sequentially referred to as first to third columns in order from top to bottom.

Here, the arrangement of photoelectric conversion units PD of n for one microlens ML is referred to as a divisional arrangement. At this time, the divisional arrangement shown in the first column has four types of upper left (LU), upper right (RU), lower left (LD), and lower right (RD). Furthermore, photoelectric conversion units (photoelectric conversion elements) PD of four divisional arrangements, that is, an upper left photoelectric conversion unit (upper left photoelectric conversion element) PDLU, an upper right photoelectric conversion unit (upper right photoelectric conversion element) PDRU, a lower left photoelectric conversion unit (lower left photoelectric conversion element) PDLD, and a lower right photoelectric conversion unit (lower right photoelectric conversion element) PDRD are provided for a pixel of each of the filter colors Rr, Gr, Gb, Bb. Each of the photoelectric conversion units PDLU, PDRU, PDLD, and PDRD is configured, for example, as a photodiode, and photoelectrically converts incident light to generate electric charges.

The respective photoelectric conversion units PDLU, PDRU, PDLD, and PDRD are connected to a floating diffusion FD via transistors TrLU, TrRU, TrLD, and TrRD functioning as reading switches, respectively.

In such a configuration, when one or more of the transistors TrLU, TrRU, TrLD, TrRD are turned on, a charge of the photoelectric conversion unit PD connected to the transistor Tr which has been turned on is transferred to the floating diffusion FD.

Therefore, when only one of the transistors TrLU, TrRU, TrLD, and TrRD is turned on, the charge of only one of the photoelectric conversion units PDLU, PDRU, PDLD, and PDRD is transferred to the floating diffusion FD, which can be read out as described later.

Furthermore, when two or more of the transistors TrLU, TrRU, TrLD, and TrRD are turned on, charges of two or more of the photoelectric conversion units PDLU, PDRU, PDLD, and PDRD are transferred to the floating diffusion FD, that is, the charges of two or more photoelectric conversion units PD can be added and read out. Therefore, a pixel of RLUD 4-division can be used, for example, as a pixel of RL 2-division by performing UD addition, used as a pixel of UD 2-division by performing RL addition, and used as a normal pixel by performing RLUD addition. Furthermore, it is also possible to add and read charges of three photoelectric conversion units in a pixel of RLUD 4-division (specifically, LU+RU+LD, LU+RU+RD, LU+LD+RD, RU+LD+RD).

The floating diffusion FD and the transistors TrLU, TrRU, TrLD, and TrRD are connected to a power supply voltage VDD via a transistor TrRES functioning as a reset switch. The floating diffusion FD is reset by turning on the transistor TrRES. At this time, if the transistors TrLU, TrRU, TrLD, and TrRD are simultaneously turned on, the respective photoelectric conversion units PDLU, PDRU, PDLD, and PDRD are also reset.

The floating diffusion FD is connected to a vertical signal line VSL via a transistor TrAMP connected to the power supply voltage VDD and functioning as an amplifying unit (amplifying element) and a transistor TrSEL functioning as a selection switch.

By turning on the transistor TrSEL, the voltage value of the floating diffusion FD is amplified by the transistor TrAMP and read out from the vertical signal line VSL.

In the pixel divisional configuration of RLUD division shown in the first column of FIG. 3, if the voltage value of the floating diffusion FD is read out in RLUD division, the possibility of applying various image processing is expanded by utilizing pupil division information in four directions, and the phase difference detection accuracy can be improved in a phase difference detection circuit 31 described later. However, the frame rate is lowered because it takes time to perform reading processing.

As described above, in this pixel divisional configuration of the RLUD division, reading in RL division and reading in UD division can also be selectively implemented. For pixels read out in RL division, phase difference detection in the horizontal direction (so-called vertical line detection) is enhanced, and for pixels read out in UD division, phase difference detection in the vertical direction (so-called horizontal line detection) is enhanced. Since the reading processing time is shorter than the reading processing time in the case of the RLUD division, it is possible to enhance the frame rate (set a high frame rate). Furthermore, a pixel which has been subjected to addition over RLUD is the same as a pixel in conventional Bayer reading, so that the frame rate is higher.

Next, the second column in FIG. 3 shows an example in which one pixel is divided into two parts of right (R) left (L).

In the divisional arrangement shown in the second column, photoelectric conversion units (photoelectric conversion elements) PD of two division arrangements, that is, a left photoelectric conversion unit (left photoelectric conversion element) PDL and a right photoelectric conversion unit (right photoelectric conversion element) PDR are provided for a pixel of each of the filter colors Rr, Gr, Gb, Bb. The reading circuit is similar to the reading circuit in the case of 4-division except that the number of photoelectric conversion units is set to two. The pixel in RL 2-division can not only read out each of R and L divisional pixel signals, but also be used as a normal pixel by performing RL addition. The phase difference detection in the horizontal direction (so-called vertical line detection) is enhanced for the reading in RL division.

Subsequently, the third column in FIG. 3 shows an example in which one pixel is divided into two parts of upper (U) and lower (D).

In the divisional arrangement shown in the third column, photoelectric conversion units (photoelectric conversion elements) PD of two divisional arrangements, that is, an upper photoelectric conversion unit (upper photoelectric conversion element) PDU and a lower photoelectric conversion unit (lower photoelectric conversion element) PDD are provided for a pixel of each of the filter colors Rr, Gr, Gb and Bb. The reading circuit is similar to the reading circuit in the case of RI 2-division. The pixel in UD 2-division can not only read out each of U and D divisional pixel signals, but also be used as a normal pixel by performing UD addition. The phase difference detection in the vertical direction (so-called horizontal line detection) is enhanced for the reading in UD division.

The image processing device 3 receives signals outputted from the image sensor 2 (divisional pixel signals of m×n generated by the photoelectric conversion units PD of m×n), and performs various image processing on the received signals to generate an image signal for display or recording.

The display unit 4 is a display configured to display an image based on the signals which have been subjected to the image processing for display by the image processing device 3. The display unit 4 is configured to perform live view display, REC view display for a still image after photographing, playback display of a recorded still image, check display of a redeveloped image when redevelopment is performed, display under recording of movie, playback display of recorded movie, etc. and also display various kinds of information associated with the image pickup apparatus, etc.

The recording medium 5 serves to store therein signals (still image signal, movie signal, etc.) which have been subjected to image processing for recording by the image processing device 3, and is configured by, for example, a memory card which is attachable and detachable to and from the image pickup apparatus, or a non-volatile memory which is provided in the image pickup apparatus.

The camera-shake detection unit 6 is a camera-shake detection circuit which is configured to include an acceleration sensor, an angular velocity sensor, and the like, detect camera-shake of the image pickup apparatus and output a detection result to the camera control unit 10.

The image stabilization unit 7 is an image stabilization circuit configured to cause at least one of the lens 1 and the image sensor 2 to move under the control of the camera control unit 10 so as to offset the camera-shake detected by the camera-shake detection unit 6, and suppress occurrence of an influence of camera-shake on an optical object image formed on the image sensor 2.

The focus control unit 8 is a focus control circuit configured to drive the focus lens included in the lens 1 under the control of the camera control unit 10 so that the object image formed on the image sensor 2 can be brought into a focused state. Furthermore, the focus control unit 8 is configured to output lens drive information such as a lens position to the camera control unit 10.

The camera operation unit 9 is an operation unit (operation device) configured to perform various operation inputs on the image pickup apparatus. The camera operation unit 9 includes operation members, for example, a power supply switch configured to turn on/off the power supply of the image pickup apparatus, a release button configured to input an instruction for photographing of a still image, photographing of a movie or the like, a mode button configured to set a still image photographing mode, a movie photographing mode, a live view mode, a still image/movie playback mode, etc., an operation button configured to instruct redevelopment, an operation button configured to set the type of a file to be recorded (JPEG image file, normal RAW image file, divided RAW image file, a combination thereof or the like).

The camera control unit 10 is a controller configured to control the entire image pickup apparatus including the lens 1, the image sensor 2, the image processing device 3, the recording medium 5, the image stabilization unit 7, the focus control unit 8 and the like based on information from the image processing device 3 (including information such as exposure level, contrast and phase difference as described later), camera-shake information from the camera-shake detection unit 6, lens drive information from the focus control unit 8, an operation input from the camera operation unit 9, etc. For example, the camera control unit 10 controls the driving of the image sensor 2 and causes the image sensor 2 to pick up an image. Furthermore, the camera control unit 10 is configured to control the aperture of the lens 1 based on the information of the exposure level.

Furthermore, the camera control unit 10 controls the focus control unit 8 based on the information of contrast or phase difference and causes the focus control unit 8 to drive the focus lens of the lens 1 and perform autofocus by contrast AF or phase difference AF.

Figure 2:
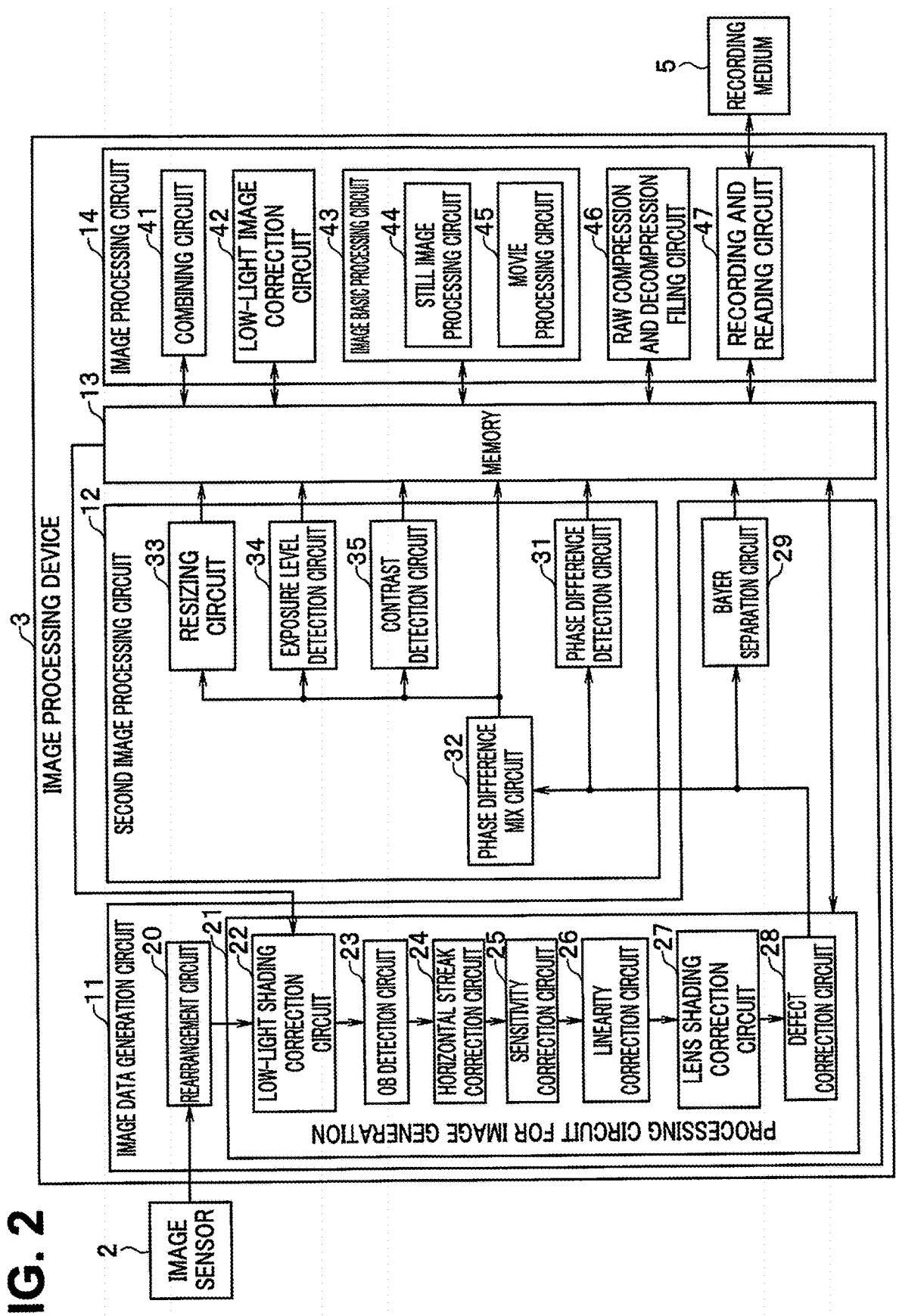
FIG. 2 is a block diagram showing a configuration of an image processing device in the first embodiment.

Next, FIG. 2 is a block diagram showing a configuration of the image processing device 3.

The image processing device 3 includes an image data generation circuit 11, a second image processing circuit 12, a memory 13, and an image processing circuit 14.

The image data generation circuit 11 generates n pieces of Bayer-type divisional image data configured by divisional pixel signals of the same divisional arrangement from divisional pixel signals of m×n.

The second image processing circuit 12 performs image processing on rearranged image data which have been processed by a later-described processing circuit for image generation 21 of the image data generation circuit 11.

The memory 13 is a frame memory configured to store therein image data which have been processed or is being processed by the image data generation circuit 11, the second image processing circuit 12, and the image processing circuit 14, and is configured by, for example, RAM (random access memory). The memory 13 stores therein, for example, n pieces of Bayer-type divisional image data generated by the image data generation circuit 11. Note that the camera control unit 10 is also allowed to access the memory 13, and information stored in the memory 13 is read out by the camera control unit 10, or the camera control unit 10 stores information into the memory 13.

The image processing circuit 14 performs image processing on the n pieces of the Bayer-type divisional image data generated by the image data generation circuit 11.

The image data generation circuit 11 includes a rearrangement circuit 20, the processing circuit for image generation 21 and a Bayer separation circuit 29.

The rearrangement circuit 20 rearranges the divisional pixel signals outputted from the image sensor 2 in an order suitable for processing on a subsequent stage in the image data generation circuit 11, thereby generating rearranged image data.

The output order of the divisional pixel signals from the image sensor 2 may be different in accordance with the manufacturer and the model number of a product (for example, in accordance with the number of column parallel-type A/D converters (so-called column ADCs) provided in the image sensor 2). Therefore, the rearrangement circuit 20 rearranges divisional pixel signals sequentially outputted from the image sensor 2 in an order suitable for processing to be executed by the processing circuit for image generation 21. However, when the divisional pixel signals outputted from the image sensor 2 are arranged in an order suitable for processing to be executed by the processing circuit for image generation 21, the rearrangement circuit 20 may not be provided. For example, a case where the reading circuit of the image sensor 2 is a circuit configured to output divisional pixel signals in an order suitable for processing to be executed by the processing circuit for image generation 21, a case where the function of the rearrangement circuit 20 is equipped in the reading circuit of the image sensor 2 or the like may be considered.

FIG. 6 is a diagram showing an example of the pixel arrangement in the image sensor 2. The number of rows and the number of columns in FIG. 6 are shown on a pixel basis (that is, not shown for each photoelectric conversion unit PD).

An optical image formed by the lens 1 is an image inverted in the vertical and horizontal directions. The character "F" in FIG. 6, etc. is used to indicate the top, bottom, left, and right of the optical image. Therefore, first row to last row are set in the direction from lower side to the upper side, and first column to last column are set in the direction from the left side to the right side in the image sensor 2 shown in FIG. 6.

The following examples may be shown as an example of the order of the divisional pixel signals outputted from the image sensor 2 in the case of 4-division pixels as shown in FIG. 6.

Figure 7:
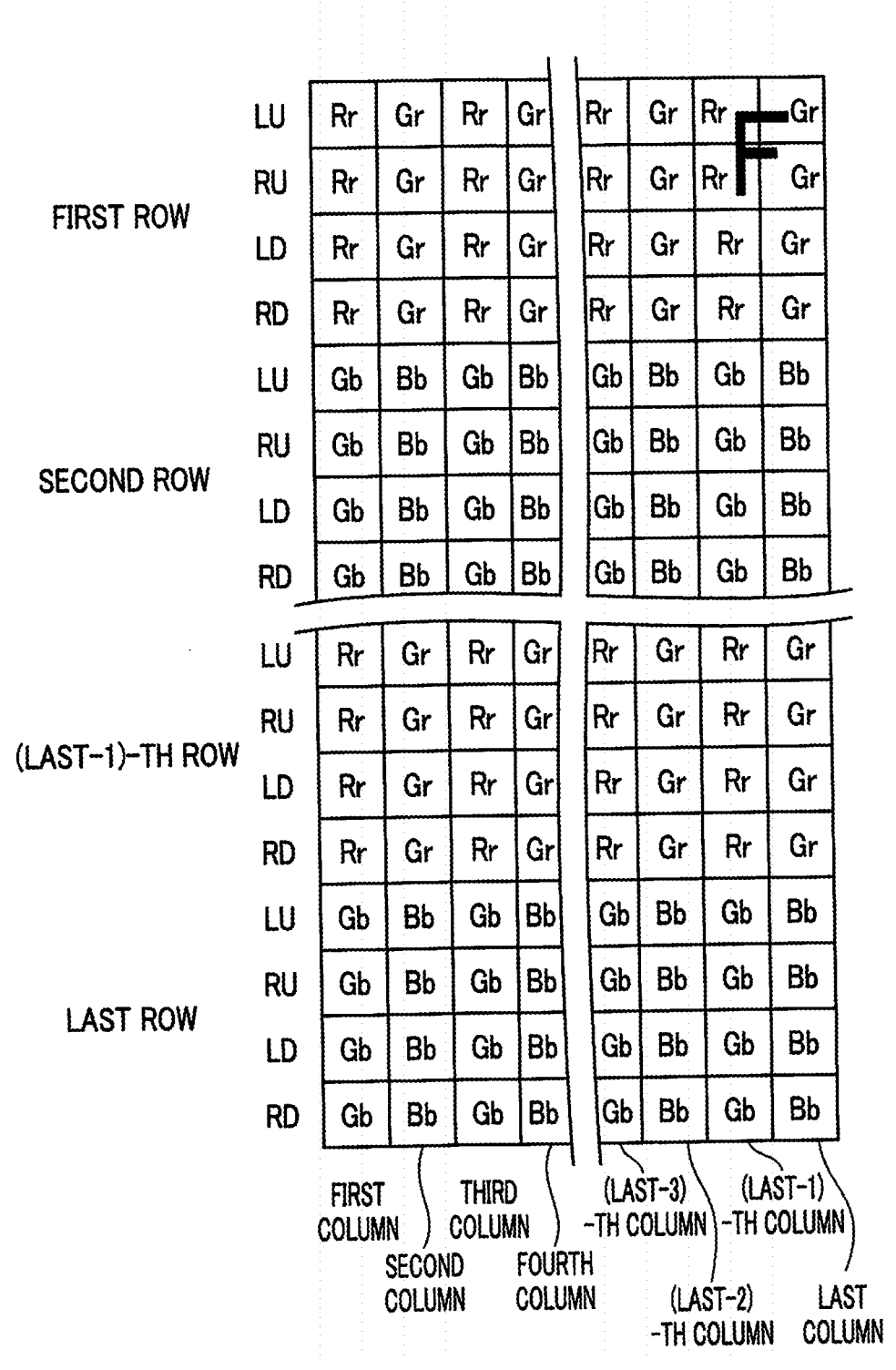

In a first example, the divisional pixel signals are outputted in the order as shown in FIGS. 7 and 8. FIG. 7 is a diagram showing an example of rearranged image data generated by the rearrangement circuit 20 in the case of the 4-division pixels, and FIG. 8 is a timing chart showing a state where rearranged image data are sequentially outputted from the rearrangement circuit 20 in the case of the 4-division pixels.

In the first example, divisional pixel signals of the divisional arrangement LU, divisional pixel signals of the divisional arrangement RU, divisional pixel signals of the divisional arrangement LD and divisional pixel signals of the divisional arrangement RD are sequentially outputted as (1-1)-th row, (1-2)-th row, (1-3)-th row and (1-4)-th row respectively from the pixels of the filter colors Rr and Gr arranged on the first row of the image sensor 2. Here, the (x-y)-th row means that a divisional pixel signal of a y-th divisional arrangement is outputted from a pixel arranged on an x-th row. With respect to the second and subsequent rows, divisional pixel signals are outputted as in the case of the first row.

Next, in a second example, although not shown, divisional pixel signals (filter colors Rr, Gr) of (1-1)-th row of the divisional arrangement LU, divisional pixel signals of (2-1)-th row of the divisional arrangement LU (filter colors Gb, Bb), divisional pixel signals of (3-1)-th row of the divisional arrangement LU (filter color Rr, Gr), divisional pixel signals of (4-1)-th row of the divisional arrangement LU (filter colors Gb, Bb), divisional pixel signals of (1-2)-th row of the divisional arrangement RU (filter colors Rr, Gr), divisional pixel signals of (2-2)-th row of the divisional arrangement RU (filter colors Gr and Bb), divisional pixel signals of (3-2)-th row of the divisional arrangement RU (filter colors Rr, Gr), divisional pixel signals of (4-2)-th row of the divisional arrangement RU (filter colors Gb, Bb), divisional pixel signals of (1-3)-th row of the divisional arrangement LD (filter colors Rr, Gr), divisional pixel signals of (2-3)-th row of the divisional arrangement LD (filter colors Gb, Bb), divisional pixel signals of (3-3)-th row of the divisional arrangement LD (filter colors Rr, Gr), divisional pixel signals of (4-3)-th row of the divisional arrangement LD (filter color Gb, Bb), divisional pixel signals of (1-4)-th row of the divisional arrangement RD (filter colors Rr, Gr), divisional pixel signals of (2-4)-th row of the divisional arrangement RD (filter colors Gb, Bb), divisional pixel signals of (3-4)-th row of the divisional arrangement RD (filter colors Rr, Gr), and divisional pixel signals of (4-4)-th row of the divisional arrangement RD (filter colors Gb, Bb) are sequentially outputted from pixels arranged from first to fourth rows of the image sensor 2. With respect to fifth and subsequent rows, divisional pixel signals are outputted every four rows as in the case of the first to fourth rows.

Furthermore, in a third example, although not shown, divisional pixel signals of the (1-1)-th row of the divisional arrangement LU (filter colors Rr, Gr), divisional pixel signals of the (2-1)-th row of the divisional arrangement LU (filter colors Gb, Bb), divisional pixel signals of the (1-2)-th row of the divisional arrangement RU (filter colors Rr, Gr), divisional pixel signals of the (2-2)-th row of the divisional arrangement RU (filter colors Gb, Bb), divisional pixel signals of the (1-3)-th row of the divisional arrangement LD (filter colors Rr, Gr), divisional pixel signals of the (2-3)-th row of the divisional arrangement LD (filter colors Gb, Bb), divisional pixel signals of the (1-4)-th row of the divisional arrangement RD (filter colors Rr, Gr), and divisional pixel signals of the (2-4)-th row of the divisional arrangement RD (filter colors Gb, Bb) are sequentially outputted from pixels arranged on the first to second rows of the image sensor 2. With respect to the third and subsequent rows, divisional pixel signals are outputted every two rows as in the case of the first to second rows.

When the divisional pixel signals are outputted from the image sensor 2 in the order shown in the first example, the rearrangement circuit 20 outputs the received divisional pixel signals in the original order, and when the divisional pixel signals are outputted in the order shown in the second example or the third example (or other order), the rearrangement circuit 20 rearranges the received divisional pixel signals in the order shown in the first example, and then outputs the rearranged divisional pixel signals.

A fourth example of the order of the divisional pixel signals outputted from the image sensor 2 in the case of the 4-division pixels as shown in FIG. 6 will be described. The fourth example is an example in which divisional pixel signals and pixel signals obtained by adding the divisional pixel signals are outputted from the image sensor 2.

The divisional pixel signals of the divisional arrangement LU, divisional pixel signals obtained by adding the divisional pixel signals of the divisional arrangement LU and the divisional pixel signals of the divisional arrangement RU, divisional pixel signals obtained by adding the divisional pixel signals of the divisional arrangement LU, the divisional pixel signals of the divisional arrangement RU and the divisional pixel signals of the divisional arrangement LD, and pixel signals obtained by adding the divisional pixel signals of the divisional arrangement LU, the divisional pixel signals of the divisional arrangement RU, the divisional pixel signals of the divisional arrangement LD and the divisional pixel signals of the divisional arrangement RD are sequentially outputted as (1-1)-th row, (1-2)-th row, (1-3)-th row and (1-4)-th row from the pixels of the filter colors Rr and Gr arranged on the first row of the image sensor 2. With respect to the second and subsequent rows, divisional pixel signals are outputted as in the case of the first row.

Here, it is merely an example to show how LU, RU, LD, and RD are added and outputted, and various other combinations may be possible. Furthermore, various examples in which the arrangement order is different as in the case of the second and third examples with respect to the first example may be possible for the fourth example. When the divisional pixel signals are outputted in the order shown in the fourth example, the rearrangement circuit 20 outputs the received divisional pixel signals in the original order, and when the divisional pixel signals are outputted from the image sensor 2 in an order different from the order in the fourth example (a different order like the second and third examples with respect to the first example), the rearrangement circuit 20 rearranges the received divisional pixel signals in the order shown in the fourth example and then outputs the rearranged divisional pixel signals.

FIG. 9 is a diagram showing another example of rearranged image data generated by performing rearrangement by the rearrangement circuit 20 as necessary according to the output format from the image sensor 2.

Figure 11:
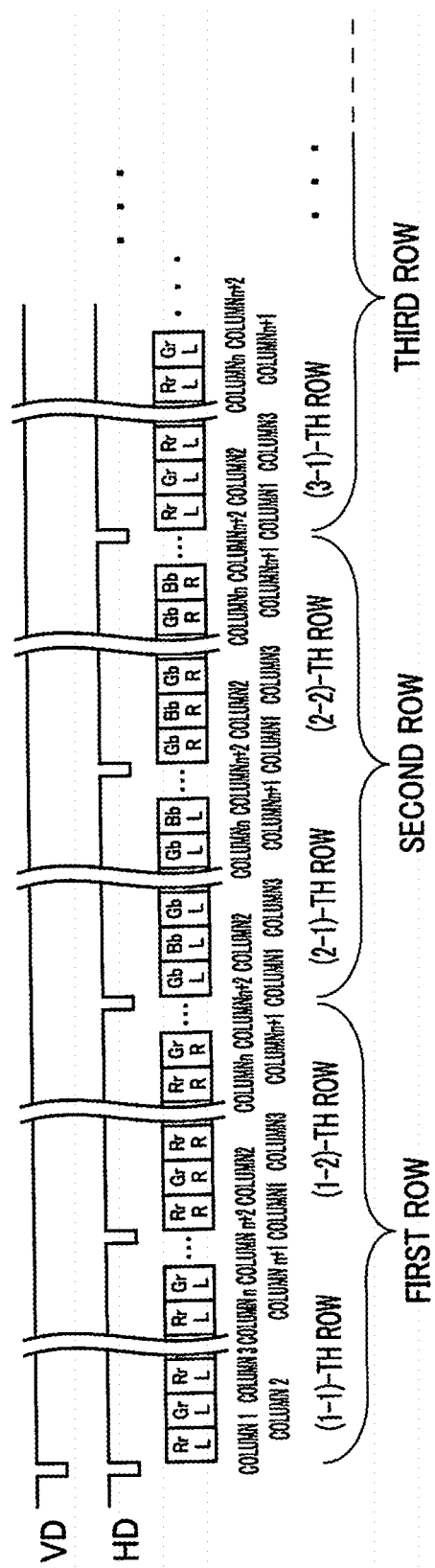
FIG. 11 is a timing chart showing a state in which rearranged image data are sequentially outputted from the rearrangement circuit in the case of the RL 2-division pixels in the first embodiment.

For example, in the case of the RL 2-division pixels, the rearrangement circuit 20 rearranges the divisional pixel signals so as to satisfy an order as shown in FIGS. 10 and 11, and output the rearranged divisional pixel signals. FIG. 10 is a diagram showing an example of the rearranged image data generated by the rearrangement circuit 20 in the case of the RL 2-division pixels, and FIG. 11 is a timing chart showing a state where the rearranged image data are sequentially outputted from the rearrangement circuit 20 in the case of the RL 2-division pixels.

With respect to the rearranged image data shown in FIGS. 10 and 11, divisional pixel signals of a divisional arrangement L and divisional pixel signals of a divisional arrangement R are sequentially outputted as (1-1)-th row and (1-2)-th row respectively from the pixels of the filter colors Rr and Gr arranged on the first row of the image sensor 2. With respect to the second and subsequent rows, divisional pixel signals are sequentially outputted as in the case of the first row.

When the order of the divisional pixel signals outputted from the image sensor 2 is other than the order shown in FIGS. 10 and 11, the rearrangement circuit 20 rearranges the received divisional pixel signals in the order shown in FIGS. 10 and 11, and then outputs the rearranged divisional pixel signals.

Next, an example in which one of the divisional pixel signals of the RL 2-division pixels and a pixel signal obtained by adding both the divisional pixel signals are outputted from the image sensor 2 will be described. In this example, the divisional pixel signals of the divisional arrangement L, and pixel signals obtained by adding the divisional pixel signals of the divisional arrangement L and the divisional pixel signals of the divisional arrangement R are sequentially outputted as (1-1)-th row and (1-2)-th row respectively from the pixels of the filter colors Rr and Gr arranged on the first row of the image sensor 2. With respect to the second and subsequent rows, the divisional pixel signals are sequentially outputted as in the case of the first row.

FIG. 12 is a diagram showing another example of the rearranged image data generated by performing rearrangement by the rearrangement circuit 20 as needed according to the output format from the image sensor 2 as in the case described above.

For example, an operation of the rearrangement circuit 20 in the case of UD 2-division pixels is substantially similar to the operation of the RL 2-division pixels by replacing L with U and replacing R with D.

The processing circuit for image generation 21 is provided at a rear stage of the rearrangement circuit 20, and performs various processings as described later on the rearranged image data generated by the rearrangement circuit 20.

The Bayer separation circuit 29 separates the rearranged image data processed by the processing circuit for image generation 21 into n pieces of Bayer-type divisional image data. If a normal Bayer image is inputted from the image sensor 2, the Bayer separation circuit 29 does not perform the Bayer separation processing.

For example, in the case of 4-division, the Bayer separation circuit 29 allocates the rearranged image data inputted in the order as shown in FIGS. 7 and 8 to an area for storing an LU Bayer image, an area for storing an RU Bayer image, an area for storing an LD Bayer image and an area for storing an RD Bayer image in the memory 13 in accordance with to which one of LU, RU, LD and RD the divisional arrangement of the photoelectric conversion units PD in which divisional pixel signals are generated corresponds, and causes the allocated rearranged image data to be stored in these areas so that a Bayer image for each divisional arrangement is configured.

Likewise, the Bayer separation circuit 29 allocates the rearranged image data inputted in the order as shown in FIG. 9 (the rearrangement is not necessarily required to be performed as described above) to an area for storing an LU Bayer image, an area for storing an LU+RU Bayer image, an area for storing an LU+RU+LD Bayer image and an area for storing an LU+RU+LD+RD Bayer image in the memory 13 in accordance with to which one of LU, LU+RU, LU+RU+LD and LU+RU+LD+RD the divisional arrangement of the photoelectric conversion units PD in which divisional pixel signals are generated corresponds, and causes the allocated rearranged image data to be stored in these areas so that a Bayer image for each divisional arrangement is configured.

FIG. 13 is a chart showing an example in the case of rearranged image data inputted in the order as shown in FIG. 7 of four pieces of Bayer-type divisional image data configured by divisional image signals which are obtained by separating rearranged image data by the Bayer separation circuit 29 in the 4-division pixels and have the same divisional arrangement. Note that a chart showing an example in the case of rearranged image data inputted in the order as shown in FIG. 9 is not shown, but is similar to the chart shown in FIG. 13.

As a result, an LU Bayer image configured by divisional pixel signals of only the divisional arrangement LU, an RU Bayer image configured by divisional pixel signals of only the divisional arrangement RU, an LD Bayer image configured by divisional pixel signals of only the divisional arrangement LD, and an RD Bayer image configured by divisional pixel signals of only the divisional arrangement RD as shown in FIG. 13 are stored in the memory 13.

In the case of the rearranged image data input in the order as shown in FIG. 9, although not shown, an LU Bayer image configured by divisional pixel signals of only the divisional arrangement LU, an LU+RU Bayer image configured by divisional pixel signals of only the divisional arrangement LU+RU, an LU+RU+LD Bayer image configured by divisional pixel signals of only the divisional arrangement LU+RU+LD, and an LU+RU+LD+RD Bayer image configured by divisional pixel signals of only the divisional arrangement LU+RU+LD+RD are stored in the memory 13.

Likewise, in the case of RL 2-division, the Bayer separation circuit 29 allocates the rearranged image data arranged as shown in FIGS. 10 and 11 to an area for storing an L Bayer image and an area for storing an R Bayer image in the memory 13 in accordance with to which one of L and R the divisional arrangement of the photoelectric conversion units PD in which divisional pixel signals are generated corresponds, and causes the allocated rearranged image data to be stored in these areas so that a Bayer image for each divisional arrangement is configured.

Likewise, in the case of rearranged image data inputted in an order as shown in FIG. 12, an L Bayer image configured by divisional pixel signals of only the divisional arrangement L, and an L+R Bayer image configured by divisional pixel signals of only the L+R divisional arrangement are stored in the memory 13.

FIG. 14 is a chart showing an example of two pieces of Bayer-type divisional image data configured by divisional pixel signals which are obtained by separating rearranged image data by the Bayer separation circuit 29 in the case of the RL 2-division pixels and have the same divisional arrangement. In the case of the rearranged image data inputted in the order as shown in FIG. 12, the chart is not shown, but is similar to the chart shown in FIG. 14.

As a result, an L Bayer image configured by divisional pixel signals of only the divisional arrangement L and an R Bayer image configured by divisional pixel signals of only the divisional arrangement R as shown in FIG. 14 are stored in the memory 13. In the case of the rearranged image data inputted in the order as shown in FIG. 12, an L Bayer image configured by divisional pixel signals of only the divisional arrangement L and an L+R Bayer image configured by divisional pixel signals of only the divisional arrangement L+R are likewise stored in the memory 13.

Likewise, in the case of UD 2-division, the Bayer separation circuit 29 allocates the rearranged image data to an area for storing a U Bayer image and an area for storing a D Bayer image in the memory 13 in accordance with to which one of U and D the divisional arrangement of the photoelectric conversion units PD in which the divisional pixel signals are generated corresponds, and causes the allocated rearranged image data to be stored in these areas so that a Bayer image for each divisional arrangement is configured. Likewise, in the case of rearranged image data related to UD inputted in a similar order to the order in the example related to LR as shown in FIG. 12, a U Bayer image configured by divisional pixel signals of only the division arrangement U and a U+D Bayer image configured by divisional pixel signals of only the divisional arrangement U+D are stored in the memory 13.

FIG. 15 is a chart showing an example of two pieces of Bayer-type divisional image data configured by divisional pixel signals which are obtained by separating rearranged image data by the Bayer separation circuit 29 in the case of the UD 2-division pixels and have the same divisional arrangement. In the case of the rearranged image data related to UD inputted in a similar order to the order in the example related to LR as shown in FIG. 12, the chart is not shown, but is similar to the chart shown in FIG. 15.

As a result, a U Bayer image configured by divisional pixel signals of only the divisional arrangement U and a D Bayer image configured by divisional pixel signals of only the divisional arrangement D as shown in FIG. 15 are stored in the memory 13. In the case of the rearranged image data related to UD inputted in a similar order to the order in the example related to LR as shown in FIG. 12, a U Bayer image configured by divisional pixel signals of only the divisional arrangement U and a U+D Bayer image configured by divisional pixel signals of only the divisional arrangement U+D are likewise stored in the memory 13.

Next, the processing circuit for image generation 21 includes at least one of a first circuit configured to process divisional pixel signals of rearranged image data while discriminating the divisional arrangement and the filter color, a second circuit configured to process the divisional pixel signals of the rearranged image data while discriminating the filter colors without discriminating the divisional arrangements, and a third circuit configured to process the divisional pixel signals of the rearranged image data while discriminating neither the divisional arrangement nor the filter color. In the following description, a case where the processing circuit for image generation 21 includes the first circuit, the second circuit and the third circuit will be described, but the processing circuit for image generation 21 is not limited to the configuration including all the first to third circuits. When a normal Bayer image is inputted from the image sensor 2, decompression processing for divisional pixel signals described here is canceled, and conventional processing for the Bayer image is performed.

Specifically, the processing circuit for image generation 21 includes a low-light shading correction circuit 22, an OB detection circuit 23, a horizontal streak correction circuit 24, a sensitivity correction circuit 25, a linearity correction circuit 26, and a lens shading correction circuit 27, and a defect correction circuit 28.

The OB detection circuit 23 and the defect correction circuit 28 in the respective circuits included in the processing circuit for image generation 21 define a first circuit, the low-light shading correction circuit 22, the sensitivity correction circuit 25, the linearity correction circuit 26, and the lens shading correction circuit 27 define a second circuit, and the horizontal streak correction circuit 24 defines a third circuit.

Note that the first circuit is not limited to the configuration including both the OB detection circuit 23 and the defect correction circuit 28, and may include at least one of the OB detection circuit 23 and the defect correction circuit 28 as long as the first circuit complies with a system requirement. The second circuit is not limited to the configuration including the low-light shading correction circuit 22, the sensitivity correction circuit 25, the linearity correction circuit 26, and the lens shading correction circuit 27, and may include at least one of the low-light shading correction circuit 22, the sensitivity correction circuit 25, the linearity correction circuit 26, and the lens shading correction circuit 27 as long as the second circuit complies with the system requirement. Furthermore, the third circuit may include circuits other than the horizontal streak correction circuit 24 as long as the third circuit complies with the system requirement.

Based on low-light shading data corresponding to the arrangement of pixels, the low-light shading correction circuit 22 performs subtraction processing on divisional pixel signals of rearranged image data and low-light shading data corresponding to pixels containing the photoelectric conversion units PD in which the divisional pixel signals are generated, thereby performing low-light shading correction while discriminating the filter colors without discriminating the divisional arrangements.

Here, the low-light shading is shading (non-uniformity of signal values of pixel signals) occurring due to circuits in the image sensor 2, and occurs even when the exposure time is short. Accordingly, the low-light shading correction is different in purpose and usage from low-light correction in long-time exposure which is performed in a low-light image correction circuit 42 described later of the image processing circuit 14.

According to the selection as to whether the low-light shading correction processing is executed, the comparison between the divisional pixel signal and a first threshold value, the comparison between the low-light shading data and a second threshold value, etc., the subtraction processing in the low-light shading correction circuit includes a case where the low-light shading data is subtracted from the divisional pixel signal and a subtraction result is output, a case where the divisional pixel signal is subtracted from the low-light shading data and a subtraction result is output, a case where the divisional pixel signal is directly outputted without executing the subtraction, and a case where the low-light shading data is directly output without executing the subtraction.

The low-light shading data corresponding to the pixel is correction frame data acquired in advance in a production adjustment process of the image pickup apparatus, correction frame data acquired by performing low-light image pickup in advance by the image pickup apparatus or the like. The low-light shading data are data which discriminate the filter colors without discriminating the divisional arrangements.

System data including low-light shading data, system programs, etc. are stored in FROM (flash read only memory) (not shown) or the like which is provided in the image processing device 3. When the system of the image processing device 3 is activated, the system data including the low-light shading data, etc. are developed from the FROM into the memory 13.

At this time, the storage capacity of the memory 13 or the capacity of the FROM (not shown) can be effectively utilized by setting the low-light shading data to correction data the number of which is preferably smaller than the number of pixels of an image to be corrected. This is also effective from the viewpoint that the time for developing the correction data in the memory can be shortened at the starting time of the system, and consequently the startup time of the system can be shortened by adopting the configuration as described above.

The low-light shading correction circuit 22 refers to the memory 13 to acquire low-light shading data including correction data the number of which is smaller than the number of pixels of an image to be corrected. The low-light shading correction circuit 22 interpolates the acquired low-light shading data to generate correction data corresponding to the number of pixels of the image to be corrected. Correction data between positions where correction data exist is generated, for example, by bilinear interpolation which is generally used for image interpolation.

Figure 16:
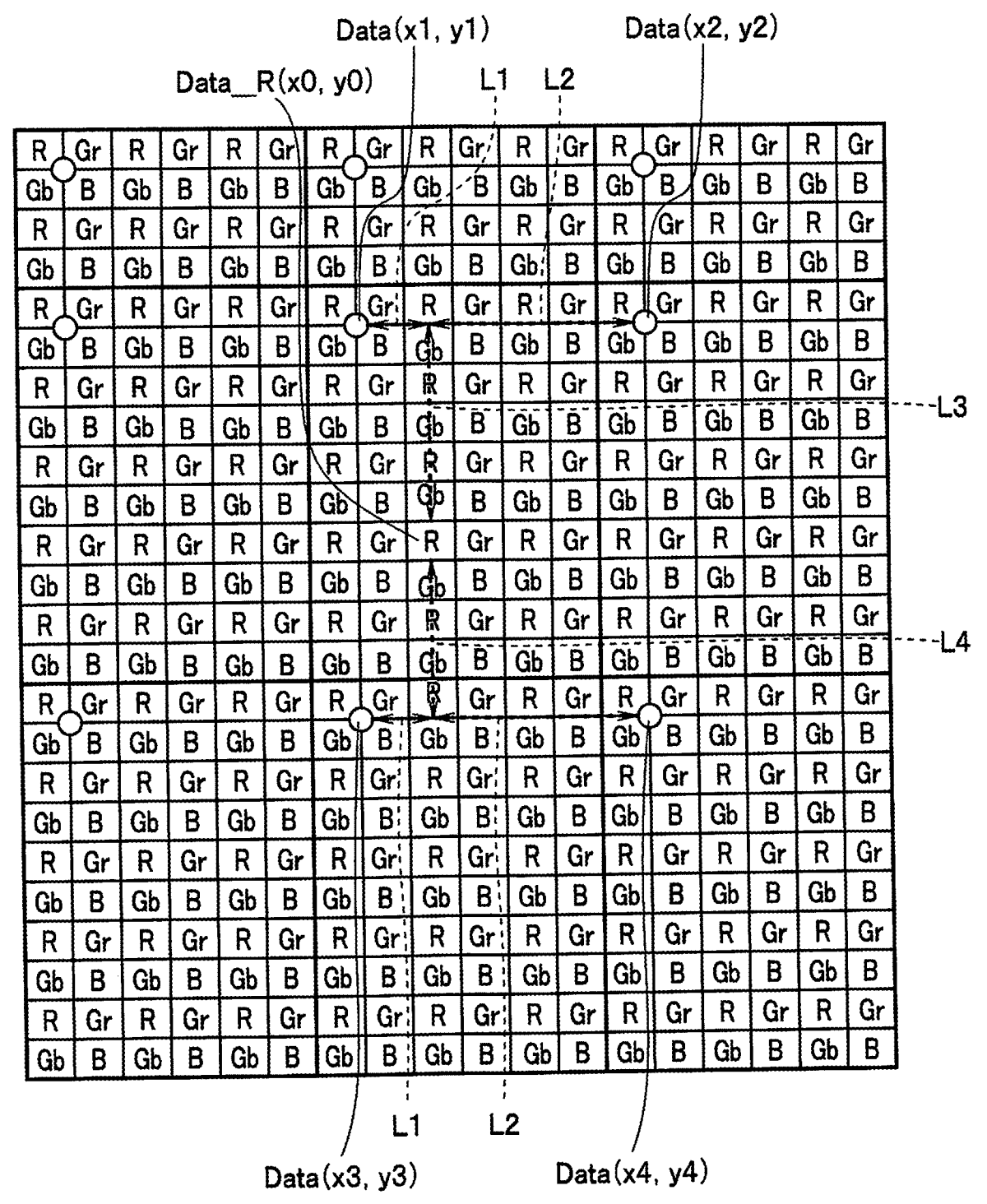

FIG. 16 is a diagram showing a method of interpolating and generating correction data for low-light shading correction. In an example shown in FIG. 16, low-light shading data developed in the memory 13 (consequently, low-light shading data stored in the FROM) are data having a pixel configuration (represented by circles in FIG. 16) which is reduced to ⅓ in the horizontal direction and ⅓ in the vertical direction with respect to a pixel configuration of an image to be corrected (for which filter colors R, Gr, Gb, B are described in FIG. 16).

Based on the low-light shading correction data represented by the circles of FIG. 16, the low-light shading correction circuit 22 generates correction data by the bilinear correction based on the low-light shading correction data as represented by the circles in FIG. 16 while discriminating the filter colors without discriminating the divisional arrangements. As an example, a case where an R pixel located at the center portion of FIG. 16 is interpolated will be described.

Four pieces of correction data in the neighborhood of the R pixel located at coordinates (x0,y0) of the center portion of FIG. 16 are represented by Data(x1,y1), Data(x2,y2), Data(x3,y3), and Data(x4,y4). Specifically, these correction data include correction data allocated to the filter colors. For example, Data (x1,y1) includes correction data Data_R (x1,y1) related to the filter color R, correction data Data_Gr (x1,y1) related to the filter color Gr, correction data Data_Gb (x1,y1) related to the filter color Gb, and correction data Data_B(x1,y1) related to the filter color B. The same applies to the other Data(x2,y2), Data(x3,y3), and Data(x4,y4).

The low-light shading correction circuit 22 generates correction data Data_R(x0,y0) for the R pixel by using an interpolation equation as shown in Equation 1 based on a distance L1 in the horizontal direction between the R pixel as a correction target and Data(x1,y1) and Data(x3,y3), a distance L2 in the horizontal direction between the R pixel as the correction target and Data(x2,y2) and Data(X4,y4), a distance L3 in the vertical direction between the R pixel as the correction target and Data(x1,y1) and Data(X2,y2), a distance L4 in the vertical direction between the R pixel as the correction target and Data(x3,y3) and Data(X4,y4), and the respective correction data related to the filter colors Data_R(x1,y1), Data_R(x2,y2), Data_R(x3,y3) and Data_R (x4,y4).

$$Data\_R(x0, y0) = \\ \{L2 \times L4 \times Data\_R(x1, y1) + L1 \times L4 \times Data\_R(x2, y2) + \\ L2 \times L3 \times Data\_R(x3, y3) + \\ L1 \times L3 \times Data\_R(x4, y4)\} / \{(L1 + L2) \times (L3 + L4)\}$$

[Equation 1]

The correction data Data_R(x0,y0) generated here is applied to the pixel data of the R pixel located at the coordinate (x0,y0). The correction data to be applied to the divisional pixel data is also likewise calculated by using four neighboring pixel data considering only the discrimination of the filter colors according to the bilinear interpolation method based on the distances between the correction target pixel and the neighboring pixels.

Note that although not shown, each circuit included in the processing circuit for image generation 21 (or which may be the image data generation circuit 11) is also connected to the memory 13, and data and parameters necessary for processing may be acquired by appropriately referring to the memory 13 (however, the processing circuit for image generation 21 (or the image data generation circuit 11) processes divisional pixel signals outputted from the image sensor 2 basically in an inputted order (even if signals of about several lines are buffered)).

When the number of filter colors is represented by k, the OB detection circuit 23 is a circuit configured to calculate OB divisional pixel signals of (k×n) discriminating the filter color and the divisional arrangement based on divisional pixel signals of n of k filter colors generated by OB pixels.

For example, when the image sensor 2 has the primary color Bayer layout (four filter colors of Rr, Gr, Gb, and Bb) and adopts 4-division pixels, the OB detection circuit 23 calculates 16 types of OB values. Furthermore, when the image sensor 2 has the primary color Bayer layout and adopts n-division pixels, the OB detection circuit 23 calculates 4n types of OB values.

The OB detection circuit 23 basically calculates an OB value for each filter color (Rr, Gr, Gb, Bb) and for each divisional arrangement from the VOB area. The reason why the OB detection circuit 23 basically calculates an OB pixel signal in the VOB area lies in that when processing is performed at high speed in an outputted order of data from the image sensor 2, it is necessary to detect the OB pixel signal at the top of the data output order, and perform various kinds of processing using an OB pixel signal level in a subsequent effective area.

However, when a sufficient OB value cannot be detected from the VOB area, the OB detection circuit 23 detects an OB value for each filter color (Rr, Gr, Gb, Bb) and for each divisional arrangement with some of OB pixels in an HOB area being set as detection targets.

The calculated OB pixel division pixel signals (k×n) are appropriately used when processing of subtracting the OB level of an image output is necessary in the processing of the sensitivity correction circuit 25, the linearity correction circuit 26, the lens shading correction circuit 27, an image basic processing circuit 43, etc. which are subsequent to the OB detection circuit 23. At this time, OB divisional pixel signals of n are subtracted for each divisional arrangement from divisional pixel signals of n generated by pixels having the same filter color as the OB pixel.

The OB pixel division pixel signals calculated by the OB detection circuit 23 are recorded at the header of a file when the file is recorded, and also used when the OB pixel divisional pixel signals are read from the file and subjected to image processing in the image basic processing circuit 43 or the like.

The horizontal streak correction circuit 24 serves to correct streaks (random streaks) which occur randomly on an image in a unit of the operation of the reading circuit (for example, on a row basis). Since horizontal streaks occur randomly, the horizontal streaks generally occur as independent events when the read timing or the reading circuit changes. There is a characteristic in that on one row, for example, which is an operation unit of the reading circuit, the same horizontal streak noise is superimposed on the HOB area and the effective area in the same row.

Therefore, for example, in the case of the 4-division pixels and when one reading circuit (FD, TrRES, TrAMP, and TrSEL) is shared by four photoelectric conversion units PDLU, PDLD, PDRU, and PDRD as shown in the first column of FIG. 3, different horizontal streak noises are superimposed on divisional pixel signals read out at different reading timings, for example, divisional pixel signals on the (1-1)-th row related to the divisional arrangement LU, divisional pixel signals on the (1-2)-th row related to the divisional arrangement RU, divisional pixel signals on the (1-3)-th row related to the divisional arrangement LD, and divisional pixel signals on the (1-4)-th row related to the divisional arrangement RD respectively as shown in FIGS. 7 and 8.

Therefore, a horizontal streak noise signal occurring in the HOB area on the same row as the (1-1)-th row is detected, and a correction is performed which removes the detected horizontal streak noise signal component from divisional pixel signals generated by the divisional pixels on the (1-1)-th row in the effective area. Similar correction processing is performed on the (1-2)-th row, the (1-3)-th row and the (1-4)-th row.

In the case of a reading circuit having a configuration different from the configuration in the first column of FIG. 3, for example, a case where one reading circuit (FD, TrRES, TrAMP and TrSEL) is shared by the photoelectric conversion unit PDLU and the photoelectric conversion unit PDLD, and another reading circuit (FD, TrRES, TrAMP and TrSEL) is shared by the photoelectric conversion unit PDRU and the photoelectric conversion unit PDRD is considered. Note that it is assumed that the vertical signal line VSL is provided to each reading circuit.

In this case, for example, the (1-1)-th row and the (1-2)-th row are read out at the same timing, and the (1-3)-th row and the (1-4)-th row are read out at the same other timing. In this case, the same horizontal streak noise is superimposed on the (1-1)-th row and the (1-2)-th row, and the same horizontal streak noise is superimposed on the (1-3)-th row and the (1-4)-th row, but the horizontal streak noise superimposed on the (1-1)-th row and the (1-2)-th row is different from the horizontal streak noise superimposed on the (1-3)-th row and the (1-4)-th row.

Therefore, a horizontal streak noise signal occurring in the HOB area in the same row as the (1-1)-th row and the (1-2)-th row is detected, and a correction is performed which removes the detected horizontal streak noise signal component from divisional pixel signals generated by the divisional pixels on the (1-1)-th row and the (1-2)-th row in the effective area. Similar correction processing is performed on the (1-3)-th row and the (1-4)-th row.

In addition, in the case of a reading circuit having a configuration further different from the configuration of the first column in FIG. 3, for example, a case where each of the four photoelectric conversion units PDLU, PDLD, PDRU and PDRD is provided with the reading circuit (FD, TrRES, TrAMP and TrSEL) and thus the reading circuit is not shared is considered.

In this case, for example, the (1-1)-th row, the (1-2)-th row, the (1-3)-th row and the (1-4)-th row are read out at the same timing. In this case, the same horizontal streak noise is superimposed on the (1-1)-th row, the (1-2)-th row, the (1-3)-th row and the (1-4)-th row.

Therefore, a horizontal streak noise signal occurring in the HOB area on the same row as the (1-1)-th row, the (1-2)-th row, the (1-3)-th row and the (1-4)-th row is detected, and a correction is performed which removes the detected horizontal streak noise signal component from the divisional pixel signals generated by the divisional pixels on the (1-1)-th row, the (1-2)-th row, the (1-3)-th row and the (1-4)-th row of the effective area.

As described above, the horizontal streak noise occurs neither inherently depending on the divisional arrangement nor inherently depending on the filter color, but occurs depending on the difference in the read timing or the reading circuit.

Specifically, the horizontal streak correction circuit 24 detects the horizontal streak noise in the HOB area, and performs horizontal streak noise correction of the effective area based on the detected horizontal streak noise.

Note that FIG. 2 shows an example in which only the horizontal streak correction is performed, but a vertical streak correction may be further performed. The vertical streak correction detects a vertical streak in the VOB area, and a correction of the effective area is performed based on the detected vertical streak. Here, the vertical streak is generally a fixed pattern noise, and is different from the horizontal streak in that it has no dependency on the operation timing of the circuit or the like.

The sensitivity correction circuit 25 performs sensitivity correction on the divisional pixel signals of the rearranged image data while discriminating the filter colors without discriminating the divisional arrangements.

The linearity correction circuit 26 performs the linearity correction on the divisional pixel signals of the rearranged image data while discriminating the filter colors without discriminating the divisional arrangements.

The sensitivity correction by the sensitivity correction circuit 25 and the linearity correction by the linearity correction circuit 26 are performed by subtracting the OB divisional pixel signal from the divisional pixel signal for each filter color (Rr, Gr, Gb, Bb) and for each divisional arrangement, multiplying a subtraction value by a gain for each filter color (Rr, Gr, Gb, Bb) (therefore, on a microlens ML basis), and then adding the OB divisional pixel signal. Accordingly, the gain itself is discriminated for the filter colors, but not discriminated for the divisional arrangements.

The lens shading correction circuit 27 performs lens shading correction on the divisional pixel signals of the rearranged image data based on the lens shading data corresponding to the arrangement of the pixels while discriminating the filter colors without discriminating the divisional arrangements.

As in the case of the sensitivity correction and the linearity correction described above, the lens shading correction by the lens shading correction circuit 27 is performed by subtracting the OB divisional pixel signal from the divisional pixel signal for each filter color (Rr, Gr, Gb, Bb) and for each divisional arrangement, multiplying a subtraction value by a gain for each filter color (Rr, Gr, Gb, Bb) (therefore, on a microlens ML basis), and then adding the OB divisional pixel signal. Accordingly, the gain itself is discriminated for the filter colors, but not discriminated for the divisional arrangements. Note that the gain is set to a gain value corresponding to an image height determined by an (x,y) address indicating a pixel position.

The defect correction circuit 28 is configured to correct a divisional pixel signal generated by a defective photoelectric conversion unit (defective photoelectric conversion element) PD contained in the image sensor 2 based on divisional pixel signals generated by photoelectric conversion units PD having the same divisional arrangement and the same filter color which are normal photoelectric conversion units (normal photoelectric conversion elements) located around the defective photoelectric conversion unit PD.

The pixel defect correction by the defect correction circuit 28 is performed based on the pixel values of pixels having the same filter color (Rr, Gr, Gb, Bb) and the same divisional arrangement. Accordingly, for example, in the case of Rr-LU divisional pixels in 4-division pixels, interpolation is performed based on right and left Rr-LU divisional pixels on the same row, Rr-Lu divisional pixels on a row which is located two rows above on the same column (because a row located one row above is Gb, Bb line), and Rr-LU divisional pixels on a row which is located two rows below on the same column (similarly, because a row located one row below is Gb, Bb line) (in the case of up and down and right and left interpolations). Accordingly, in this case, the defect correction circuit 28 includes line buffers for a plurality of lines. Furthermore, in place of the up and down and right and left interpolations, right and left interpolation may be performed more simply.

As described above, the rearranged image data processed by the processing circuit for image generation 21 is not only inputted to the Bayer separation circuit 29 to form a Bayer image for each divisional arrangement, but also inputted to the second image processing circuit 12 to be processed.

The second image processing circuit 12 includes a phase difference detection circuit 31, a phase difference mix circuit 32, a resizing circuit 33, an exposure level detection circuit 34, and a contrast detection circuit 35.

The phase difference detection circuit 31 detects phase difference information based on the rearranged image data processed by the processing circuit for image generation 21. Then, the phase difference detection circuit 31 stores the detected phase difference information in the memory 13. The phase difference information detected here is read out from the memory 13 by the camera control unit 10, and used as information for image plane phase difference AF. In other words, the camera control unit 10 drives the focus lens of the lens 1 by the focus control unit 8 based on the image plane phase difference AF.

Note that, as described above, for example, two methods of a normal reading method and an addition reading method are available as a method of reading divisional pixel signals from the image sensor 2.

When a case where one pixel is divided into four divisional pixels of an LU divisional pixel, an RU divisional pixel, an LD divisional pixel and an RD divisional pixel is exemplified, the normal reading method is a reading method for reading each of a divisional a divisional pixel signal SigLU generated by the LU divisional pixel, a divisional pixel signal SigRU generated by the RU divisional pixel, a divisional pixel signal SigLD generated by the LD divisional pixel, and a divisional pixel signal SigRD generated by the RD divisional pixel.

On the other hand, the addition reading method is a reading method for reading one divisional pixel signal, a signal obtained by adding two divisional pixel signals, a signal obtained by adding three divisional pixel signals, and a signal obtained by adding all four divisional pixel signals. As a specific example, SigLU, (SigLu+SigRu), (SigLu+SigRu+SigLD), and (SigLU+SigRU+SigLD+SigRD) are read out.

In the reading circuit shown in the first column of FIG. 3, the reading as described above is performed by first reading out the divisional pixel signal SigLU transferred to the floating diffusion FD by turning on only the transistor TrLU, then accumulating and then reading out a divisional pixel signal (SigLU+SigRU) added to the floating diffusion FD by turning on the transistor TrRU, further accumulating and then reading out a divisional pixel signal (SigLU+SigRU+SigLD) added to the floating diffusion FD by turning on the transistor TrLD, and finally accumulating and then reading out a divisional pixel signal (SigLU+SigRU+SigLD+SigRD) added to the floating diffusion FD by turning on the transistor TrRD.

Therefore, with respect to the signals read out according to the normal reading method, the phase difference detection circuit 31 may directly use the signals for phase difference detection. However, with respect to the signals read out according to the addition reading method, the phase difference detection circuit 31 performs phase difference detection after restoring the four divisional pixel signals.

In the example described above, the phase difference detection can be performed by restoring the divisional pixel signal SigRD by performing the calculation of (SigLU+SigRU+SigLD+SigRD)−(SigLU+SigRU+SigLD), restoring the divisional pixel signal SigLD by performing the calculation of (SigLU+SigRU+SigLD)−(SigLU+SigRU), restoring the divisional pixel signal SigRU by performing the calculation of (SigLU+SigRU)−SigLU, and using directly the output signal of the divisional pixel signal SigLU.

The phase difference mix circuit 32 generates pixel signals by adding divisional pixel signals of n generated by pixels to the rearranged image data processed by the processing circuit for image generation 21, thereby generating one piece of Bayer-type normal image data (normal RAW image data) configured by the pixel signal. If a normal Bayer image is inputted from the image sensor 2, this phase difference mixing process is not performed.

Note that when the reading method of the divisional pixel signals from the image sensor 2 is the addition reading method as described above, the phase difference mix circuit 32 may select and output a signal obtained by adding all the four divisional pixel signals (SigLu+SigRu+SigLD+SigRD).

The resizing circuit 33, the exposure level detection circuit 34, and the contrast detection circuit 35 are circuits configured to perform processing on Bayer-type normal image data generated by the phase difference mix circuit 32. Here, an example in which the second image processing circuit 12 includes the resizing circuit 33, the exposure level detection circuit 34, and the contrast detection circuit 35 will be described, but any of these circuits may be omitted as long as the second image processing circuit 12 complies with the system requirements. Alternatively, the second image processing circuit 12 may further include another circuit configured to perform processing on Bayer-type normal image data.

The resizing circuit 33 performs resizing processing on Bayer-type normal image data. Here, the resized image data are used for, for example, a REC view or a thumbnail when a still image is generated, or used to change the aspect or image size of an image from the image sensor 2 when a movie is generated or a live view image is generated.

For example, with respect to a movie, the resizing circuit 33 is used for conversion to the aspect of 16:9 and the image size corresponding to the movie. Furthermore, for example, with respect to a live view image, the resizing circuit 33 is used for conversion to the aspect of 4:3 and the image size corresponding to the live view image.

A background for needing the resizing circuit 33 lies in that the aspect and size of images outputted from the image sensor 2 are frequently different from the aspect and size required by movies and live view images due to restrictions on the reading operation of the image sensor 2 (restrictions such as averaging and decimation in the horizontal direction, and averaging and decimation in the vertical direction).

The exposure level detection circuit 34 detects an exposure level for controlling the exposure of the image sensor 2 based on the Bayer-type normal image data. Then, the exposure level detection circuit 34 stores the detected exposure level in the memory 13. The exposure level detected here is read out from the memory 13 by the camera control unit 10, and used as information for automatic exposure control (AE). The camera control unit 10 performs an AE calculation based on the exposure level, drives the aperture of the lens 1 based on a calculation result, adjusts the signal amplification factor (so-called ISO sensitivity) of the image sensor 2 (or the image processing device 3), and controls an exposure time by an electronic shutter (or mechanical shutter not shown) of the image sensor 2.

The contrast detection circuit 35 detects the contrast of the Bayer-type normal image data. Then, the contrast detection circuit 35 stores the detected contrast in the memory 13. The contrast detected here is read out from the memory 13 by the camera control unit 10, and used as information for contrast AF. In other words, the camera control unit 10 drives the focus lens of the lens 1 by the focus control unit 8 based on the contrast AF.

Note that only one of the image plane phase difference AF and the contrast AF may be performed, or both the image plane phase difference AF and the contrast AF may be used complementarily. For example, when both the image plane phase difference AF and the contrast AF are used, a method of first performing the image plane phase difference AF to move the focus lens to a roughly focusing position, and then performing the contrast AF to move the focus lens to a precisely focusing position or the like is available.

The image processing circuit 14 includes a combining circuit 41, a low-light image correction circuit 42, an image basic processing circuit 43, a RAW compression circuit, a RAW decompression circuit, and a RAW compression and decompression filing circuit 46 which also serves as a filing circuit, and a recording and reading circuit 47 that serves as a recording circuit and a reading circuit.

Note that an example in which the image processing circuit 14 includes the combining circuit 41, the low-light image correction circuit 42, the image basic processing circuit 43, the RAW compression and decompression filing circuit 46, and the recording and reading circuit 47 will be described below, but the image processing circuit 14 is unnecessary to include all the circuits as long as the image processing circuit 14 complies with the system requirements. Moreover, it is not necessary to provide all the processing functions in the respective circuits.

For example, in a photographing system which does not assume such a long-time photographing scene that image quality deterioration caused by an increase in dark current occurs, it is unnecessary to provide the low-light image correction circuit 42. In the case of configuring a photographing system that does not require compression of the file size by RAW compression, for example, a photographing system that does not treat large image sizes, or a photographing system in which the capacity of the recording medium is almost unlimited, the RAW compression and decompression filing circuit 46 does not need to have the RAW compression and decompression function (in this case, it is sufficient only to simply carry the filing circuit function).

The combining circuit 41 adds the divisional pixel signals of n generated by the pixels to the n pieces of Bayer-type divisional image data to generate pixel signals, thereby generating one piece of Bayer-type normal image data configured by the pixel signals. A circuit configured to generate a multiple-exposure image by using an image of another frame, which may also be provided in a conventional system, is used as it is for the combining circuit 41. Therefore, the advantage is that it is not necessary to add a new circuit separately. The combining circuit 41 is mainly used when redevelopment processing is performed from a divisional RAW image file recorded in the recording medium 5.

The low-light image correction circuit 42 performs processing of subtracting the low-light divisional image from the divisional image data having corresponding divisional arrangements out of then pieces of Bayer-type divisional image data and n pieces of Bayer-type low-light divisional image data generated under a state where the image sensor 2 is light-shielded, for each pixel position and for each of the divisional arrangements, thereby performing low-light correction.

The low-light image correction circuit 42 also performs the processing of subtracting the low-light image data for each pixel position on the Bayer-type normal image data generated by the phase difference mix circuit 32 and the resized Bayer-type normal image data subjected resizing processing by the resizing circuit 33, thereby performing the low-light correction.

Note that the low-light image correction circuit 42 mainly performs processing of correcting image deterioration caused by dark current on a long-time exposure image for which the exposure time is not less than a predetermined time (note that the predetermined time may be changed according to the temperature of the image sensor 2 or the like). Here, the image deterioration caused by dark current is likely to occur when the exposure time is relatively long. Also, it is known that the amount of generation of the dark current differs according to the temperature of the image sensor 2. Therefore, it is necessary to acquire n pieces of Bayer-type low-light divisional image data generated in a state where the image sensor 2 is light-shielded every time image pickup is performed. However, when the image is not a long-time exposure image, the processing of the low-light image correction circuit 42 may be omitted.

When movie processing or live view image processing is performed, it is general that the low-light correction based on two-pieces subtraction in step S13 or step S43 described later is not performed.

In order to perform the processing by the low-light image correction circuit 42 after the resizing processing has been performed, the resized low-light image data are necessary. However, when the resizing processing is performed for REC view or a thumbnail, low-light image data are not prepared, and the low-light image correction processing is omitted in some cases because an effect on appearance by the presence or absence of the low-light image correction processing is generally small.

The image basic processing circuit 43 performs basic image processing such as demosaicking processing, noise cancel processing, gamma conversion processing, white balance processing, color matrix processing, and edge processing on Bayer-type normal image data which are generated by the phase difference mix circuit 32 and are subjected to low-light correction by the low-light image correction circuit 42 as necessary, or Bayer-type normal image data generated by the combining circuit 41. Here, the basic image processing is referred to because the image basic processing circuit 43 performs the processing which is commonly executed to generate a still image, a movie, and a live view image.

The image basic processing circuit 43 further includes a still image processing circuit 44 and a movie processing circuit 45.

The still image processing circuit 44 generates a JPEG file, for example, by performing JPEG compression (however, the compression method is not limited to JPEG) on a still image on which basic image processing has been performed. The still image processing circuit 44 may include a processing function unique to still images. For example, still image photographing is performed with relatively high sensitivity as compared with movie photographing or live view image display, and furthermore the still image photographing is performed for a relatively long exposure time. Therefore, it is generally required to perform very powerful noise cancel processing on still images. Accordingly, apart from the noise cancel processing function installed in the image basic processing circuit 43, a relatively large-scale noise cancel processing circuit may be installed in the still image processing circuit 44 so that powerful noise cancellation is performed on still image photographing even at the cost of reducing the processing speed.

The movie processing circuit 45 generates an MPEG file, for example, by performing MPEG compression (however, the compression method is not limited to MPEG) on a movie frame which has been subjected to the basic image processing. In other words, various types of video codec techniques and audio codec techniques are used to generate movie files, and it is considered that new codecs with high efficiency and high quality will appear in the future. For example, MPEG-4, H.264, H.265, etc. are currently used as video codecs. Therefore, it is assumed that the MPEG files indicate the entire movie files generated by using these various video codec techniques and audio codec techniques. Furthermore, the movie processing circuit 45 may include a processing function unique to movies. For movies, for example, a noise cancel technique between movie frames is generally known. Therefore, apart from the noise cancel processing function installed in the image basic processing circuit 43, the movie processing circuit 45 may be equipped with a noise cancel processing function between movie frames.

The RAW compression and decompression filing circuit 46 serves as a RAW compression circuit configured to compress each of n pieces of Bayer-type divisional image data, a filing circuit configured to generate one file (divisional RAW image file) containing n pieces of Bayer-type divisional image data, and a RAW decompression circuit configured to decompress each of the compressed n pieces of Bayer-type divisional image data.

The RAW compression and decompression filing circuit 46 further includes a RAW compression circuit configured to compress Bayer-type normal image data which are generated by the phase difference mix circuit 32 and has subjected to low-light correction by the low-light image correction circuit 42 as necessary, a filing circuit configured to file the Bayer-type normal image data to generate a normal RAW image file, and a RAW decompression circuit configured to decompress the compressed Bayer-type normal image data.

The recording and reading circuit 47 is a recording circuit configured to record, into the recording medium 5, a divisional RAW image file and a normal RAW image file generated by the RAW compression and decompression filing circuit 46, a JPEG file generated by the still image processing circuit 44, and an MPEG file generated by the movie processing circuit 45, and a reading circuit for reading the divided RAW image file, JPEG file, normal RAW image file, and MPEG file recorded on the recording medium 5.

Figure 17:
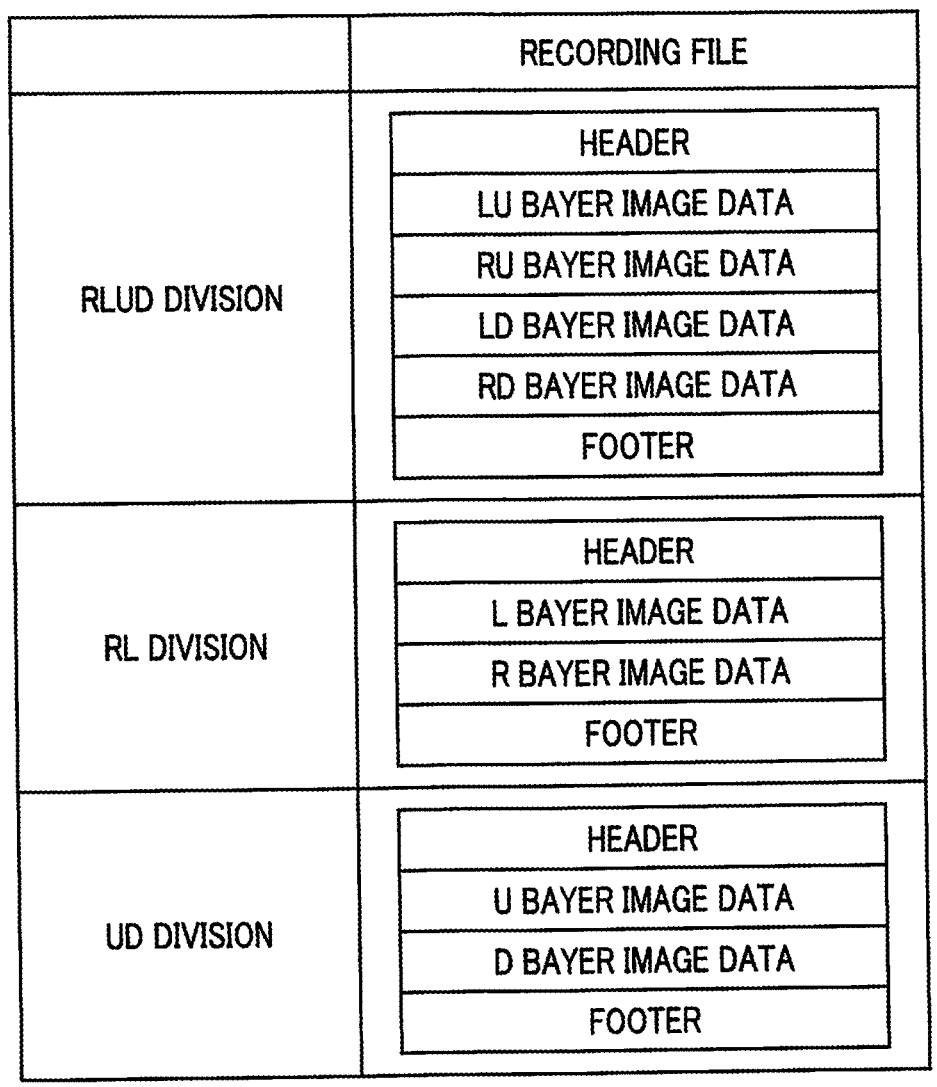
FIG. 17 is a chart showing a configuration example of a divisional RAW image file recorded in a recording medium in 4-division and 2-division in the first embodiment.

FIG. 17 is a chart showing a configuration example of the divisional RAW image file to be recorded on the recording medium 5 in 4-divisions and 2-division.

The divisional RAW image file includes, for example, a header, an image data main body, and a footer. In the case of 4-division pixels, LU Bayer image data, RU Bayer image data, LD Bayer image data, and RD Bayer image data are included as the image data main body. Here, a file format for defining the arrangement order of the respective Bayer image data is not limited to an example of FIG. 17, and any arrangement order may be used. FIG. 17 shows the example in which the footer is included. However, since the footer is an option, it is possible to include no footer.

Note that although not shown, when divisional pixel signals as shown in FIG. 9 are outputted from the image sensor 2 and processed by the image processing device 3, for example, in the case of 4-division pixels, LU Bayer image data, LU+RU Bayer image data, LU+RU+LD Bayer image data, and LU+RU+LD+RD Bayer image data are included in the image data main body of the divisional RAW image file.

The same applies to a case where divisional pixel signals of R and L as shown in FIG. 12 are outputted and processed, or a case where divisional pixel signals of U and D are outputted and processed as in the case of FIG. 12.

In the case of RL 2-division, L Bayer image data and R Bayer image data are included as the image data main body, and in the case of UD 2-division, U Bayer image data and D Bayer image data are included as the image data main body.

Figure 4:
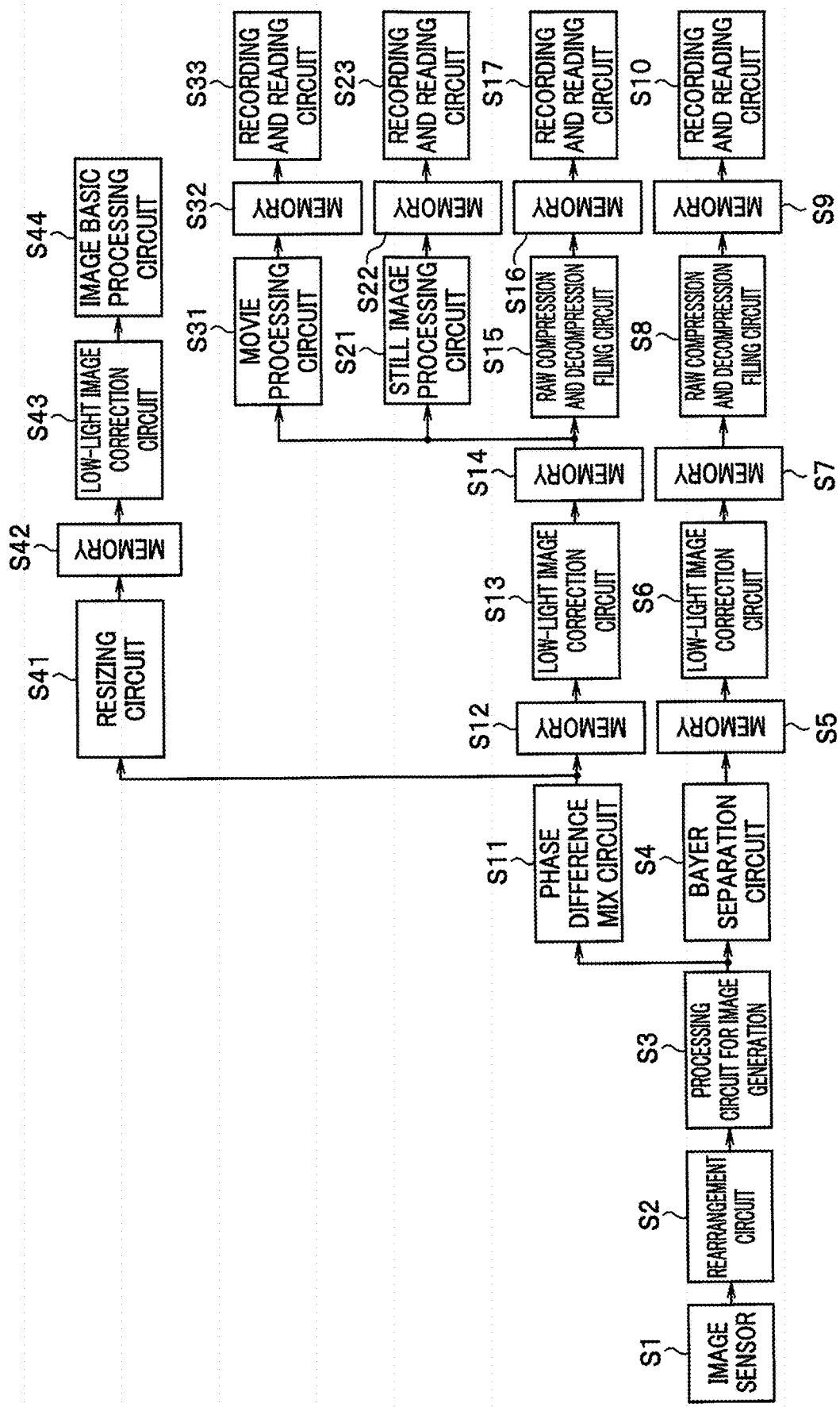
FIG. 4 is a diagram showing a flow of processing divisional pixel signals outputted from the image sensor in the first embodiment.

Next, FIG. 4 is a diagram showing a flow of processing the divisional pixel signals outputted from the image sensor 2.

The image sensor 2 performs exposure to generate divisional pixel signals, and starts to output the divisional pixel signals in synchronization with a vertical synchronization signal VD (see FIGS. 18 and 19) (step S1).

The divisional pixel signals outputted from the image sensor 2 are rearranged in an order suitable for the processing of the processing circuit for image generation 21 by the rearrangement circuit 20, and outputted as rearranged image data (step S2).

The rearranged image data outputted from the rearrangement circuit 20 are processed by the processing circuit for image generation 21 to be subjected to low-light shading correction, OB detection, horizontal stripe correction (or further vertical stripe correction), sensitivity correction, linearity correction, lens shading correction, defect correction, and the like (step S3).

As the processing for generating the divisional RAW image file, subsequently, the divisional pixel signals which have been processed by the processing circuit for image generation 21 are inputted to the Bayer separation circuit 29, and Bayer-type divisional image data for each divisional arrangement is configured by the Bayer separation circuit 29 (step S4).

The Bayer-type divisional image data for each divisional arrangement generated by the Bayer separation circuit 29 is stored in the memory 13 (step S5).

The low-light image correction circuit 42 reads each Bayer-type divisional image data for each divisional arrangement stored in the memory 13, and performs subtraction processing on each low-light divisional image data for each divisional arrangement to perform low-light correction (step S6).

The Bayer-type divisional image data for each divisional arrangement which has been subjected to low-light correction by the low-light image correction circuit 42 is stored in the memory 13 (step S7).

The RAW compression and decompression filing circuit 46 reads, from the memory 13, the Bayer-type divisional image data for each divisional arrangement which has been subjected to low-light correction, performs RAW compression on each piece of Bayer-type divisional image data, and then files the RAW-compressed Bayer-type divisional image data to generate one file (divisional RAW image file)(Step S8).

The divisional RAW image file generated by the RAW compression and decompression filing circuit 46 is stored in the memory 13 (step S9).

The recording and reading circuit 47 records the divisional RAW image file stored in the memory 13 into the recording medium 5 (step S10).

When a normal RAW image, a still image, a movie, a live view image, a REC view image, a thumbnail image or the like is generated, the phase difference mix circuit 32 adds the divisional pixel signals processed by the processing circuit for image generation 21 in step S3, for each pixel position to generate a Bayer-type normal image data (normal RAW image data) (step S11).

Note that the processing of step S4 in which the Bayer separation circuit 29 configures the Bayer-type divisional image data for each divisional arrangement, and the processing of step S11 in which the phase difference mix circuit 32 adds the divisional pixel signals for each pixel position to generate the Bayer-type normal image data (normal RAW image data) are executed in parallel, whereby the processing speed can be increased. Furthermore, the processing of step S41 by the resizing circuit 33 described later is also executed in parallel, whereby n pieces of Bayer-type divisional image data, one piece of Bayer-type normal image data, and resize image data of a normal image can be generated simultaneously in parallel and stored in the memory 13. At this time, the image processing circuit 14 further processes a plurality of generated Bayer images simultaneously in parallel, whereby the speed of the entire processing when various plural pieces of processing associated with a normal RAW image, a still image, a movie, a live view image, a REC view image, a thumbnail image, etc. are executed can be further increased.

When a normal RAW image, a still image, or a movie is generated, Bayer-type normal image data generated by the phase difference mix circuit 32 are stored in the memory 13 (steps S11 and S12). Note that in FIG. 4, the storage into the memory 13 in step S12 and the storage into the memory 13 in step S5 are performed on different memory areas of the same memory 13. Storage of data in a different memory area when different data is stored into the memory 13 is the same with respect to other description portions regarding storage into the memory 13 in FIG. 4.

The low-light image correction circuit 42 reads the Bayer-type normal image data stored in the memory 13 and performs the subtraction processing on the low-light image data to thereby perform the low-light correction (step S13). Here, when the movie processing or the live view image processing is performed, it is general that the low-light correction based on two-pieces subtraction in step S13 is not performed.

The Bayer-type normal image data which has been subjected to the low-light correction by the low-light image correction circuit 42 is stored in the memory 13 (step S14).

The RAW compression and decompression filing circuit 46 reads, from the memory 13, the Bayer-type normal image data that has been subjected to the low-light correction, performs the RAW compression, and then generates a normal RAW image file (step S15).

The normal RAW image file generated by the RAW compression and decompression filing circuit 46 is stored in the memory 13 (step S16).

The recording and reading circuit 47 records the normal RAW image file stored in the memory 13 into the recording medium 5 (step S17).

When a still image is generated, the image basic processing circuit 43 reads the Bayer-type normal image data which is stored into the memory 13 in step S14 and has been subjected to low-light correction, the image basic processing circuit 43 performs basic image processing, and then a JPEG file is generated by the still image processing circuit 44 (step S21).

The JPEG file generated by the still image processing circuit 44 is stored in the memory 13 (step S22).

The recording and reading circuit 47 records the JPEG file stored in the memory 13 into the recording medium 5 (step S23).

When a movie is generated, the image basic processing circuit 43 reads the normal image data stored in the memory 13 in step S14, the image basic processing circuit 43 performs basic image processing, and then the movie processing circuit 45 generates an MPEG file (step S31). Here, when the movie processing or the live view image processing is performed, it is general that the low-light correction based on the two-pieces subtraction in step S13 is not performed.

The MPEG file generated by the movie processing circuit 45 is stored in the memory 13 (step S32).

The recording and reading circuit 47 records the MPEG file stored in the memory 13 into the recording medium 5 (step S33).

When a live view image, a REC view image, or a thumbnail image is generated, the Bayer-type normal image data generated by the phase difference mix circuit 32 in step S11 is subjected to resizing processing by the resizing circuit 33 (step S41).

Note that the processing of step S41 in which the resizing circuit 33 performs the resizing processing on the normal image data, the processing of step S4 in which the Bayer separation circuit 29 configures the Bayer-type divisional image data for each divisional arrangement, and the processing of step S11 by the phase difference mix circuit 32 may be executed in parallel.

The Bayer-type normal image data resized by the resizing circuit 33 are stored in the memory 13 (step S42).

The low-light image correction circuit 42 reads the resized Bayer-type normal image data stored in the memory 13, and performs the subtraction processing on the low-light image data to thereby perform the low-light correction (step S43). As described above, when the movie processing or the live view image processing is performed, it is general that the low-light correction based on the two-pieces subtraction in step S13 or step S43 is not performed.

Thereafter, the Bayer-type normal image data which has been subjected to the low-light correction is subjected to image processing by the image processing circuit 14 (step S44) to generate a live view image, a REC view image, and a thumbnail image, and the live view image, the REC view image and the thumbnail image to be stored in the memory 13. The live view image stored in the memory 13 is displayed as a live view image on the display unit 4. The REC view image stored in the memory 13 is displayed on the display unit 4. The thumbnail image stored in the memory 13 is read out by the RAW compression and decompression filing circuit 46, and stored at a header or the like of an image file when the image file is generated.

Note that the foregoing processing of steps S1 to S10, the processing of steps S11 to S17, the processing of steps S21 to S23, the processing of steps S31 to S33, and the processing of steps S41 to S44 may be performed appropriately in parallel as necessary. Accordingly, the image pickup apparatus according to the present embodiment can perform, for example, recording of JPEG files, simultaneous recording of JPEG files and normal RAW image files, simultaneous recording of JPEG files and divisional RAW image files, recording of MPEG files, simultaneous recording of JPEG files and MPEG files.

It is assumed that n pieces of Bayer-type divisional image data generated by the Bayer separation circuit 29, one piece of Bayer-type normal image data generated by the phase difference mix circuit 32, and resized image data of a normal image generated by the resizing circuit 33 are stored in the memory 13. In this state, the image processing circuit 14 may read out the n pieces of Bayer-type divisional image data, the one piece of Bayer-type normal image data and the resized image data of the normal image in an appropriate order from the memory 13, and perform the image processing on these read-out data.

Figure 5:
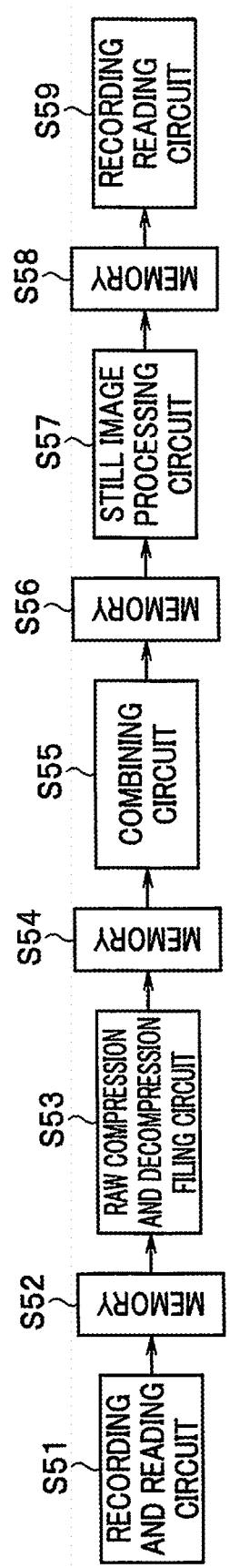
FIG. 5 is a diagram showing a flow of processing for performing redevelopment from a file including a plurality of divisional image data recorded in a recording medium in the first embodiment.

FIG. 5 is a diagram showing a flow of processing for performing redevelopment from a file including a plurality of divisional image data recorded in the recording medium 5.

The recording and reading circuit 47 reads the divisional RAW image file recorded in the recording medium 5 (step S51).

The divisional RAW image file read out by the recording and reading circuit 47 is stored in the memory 13 (step S52).

The RAW compression and decompression filing circuit 46 reads a divisional RAW image file from the memory 13, extracts each of the RAW-compressed divisional image data, and decompresses the extracted RAW-compressed divisional image data, thereby restoring the Bayer-type divisional image data for each divisional arrangement (step S53).

The Bayer-type divisional image data for each divisional arrangement restored by the RAW compression and decompression filing circuit 46 is stored in the memory 13 (step S54).

The combining circuit 41 reads the restored Bayer-type divisional image data for each divisional arrangement from the memory 13, and adds the divisional pixel signals of the divisional image data for each pixel position to generate one piece of Bayer-type normal image data (step S55). Here, when the format of the divisional pixel data read from the memory 13 is a format in which data of a format as shown in FIG. 9 or FIG. 12 is subjected to Bayer separation, the addition processing by the combining circuit 41 is not necessary. In the format as shown in FIG. 9 or FIG. 12, the combination processing is not performed because a signal added to the divisional pixel signal at the output stage of the image sensor 2 is included. Furthermore, when a normal Bayer image is inputted from the image sensor 2, the combination processing for this image is not performed.

The Bayer-type normal image data generated by the combining circuit 41 is stored in the memory 13 (step S56).

The Bayer-type normal image data stored in the memory 13 is read by the image basic processing circuit 43, the image basic processing circuit 43 performs basic image processing on the read Bayer-type normal image data, and then the still image processing circuit 44 generates a PEG file (step S57). At this time, a user appropriately manually set parameters, etc. used for image processing, whereby an image different from an image under photographing can be acquired by redevelopment.

The JPEG file generated by the still image processing circuit 44 is stored in the memory 13 (step S58).

The recording and reading circuit 47 records the JPEG file stored in the memory 13 into the recording medium 5 (step S59).

Note that the image data generation circuit 11 and the second image processing circuit 12 are provided on an upstream side of the memory 13, and the image processing circuit 14 is provided on a downstream side of the memory 13 in a route in which the image data which are outputted from the image sensor 2 and stored in the memory 13 flow.

In such a configuration, a processing circuit that is relatively small in scale and important to perform high-speed processing may be arranged at the image data generation circuit 11 and the second image processing circuit 12 on the upstream side. As a result, the image data generation circuit 11 and the second image processing circuit 12 can process the divisional pixel signals of m×n outputted from the image sensor 2 in proportion to an output speed according to an output order. Therefore, a next image pickup operation of the image sensor 2 is not hindered, and thus the frame rate is not reduced.

Furthermore, a processing circuit that is relatively large in scale and performs complicated image processing may be arranged at the image processing circuit 14 on the downstream side. As a result, the image processing circuit 14 can perform image processing in an order suitable for the image processing circuit 14 while referring to image data which have been already stored in the memory 13. Even when such processing is performed, the flow of image data on the upstream side which directs from the image sensor 2 to the memory 13 is not influenced, so that a next image pickup operation of the image sensor 2 is not hindered and thus the frame rate is not reduced.

Figure 18:
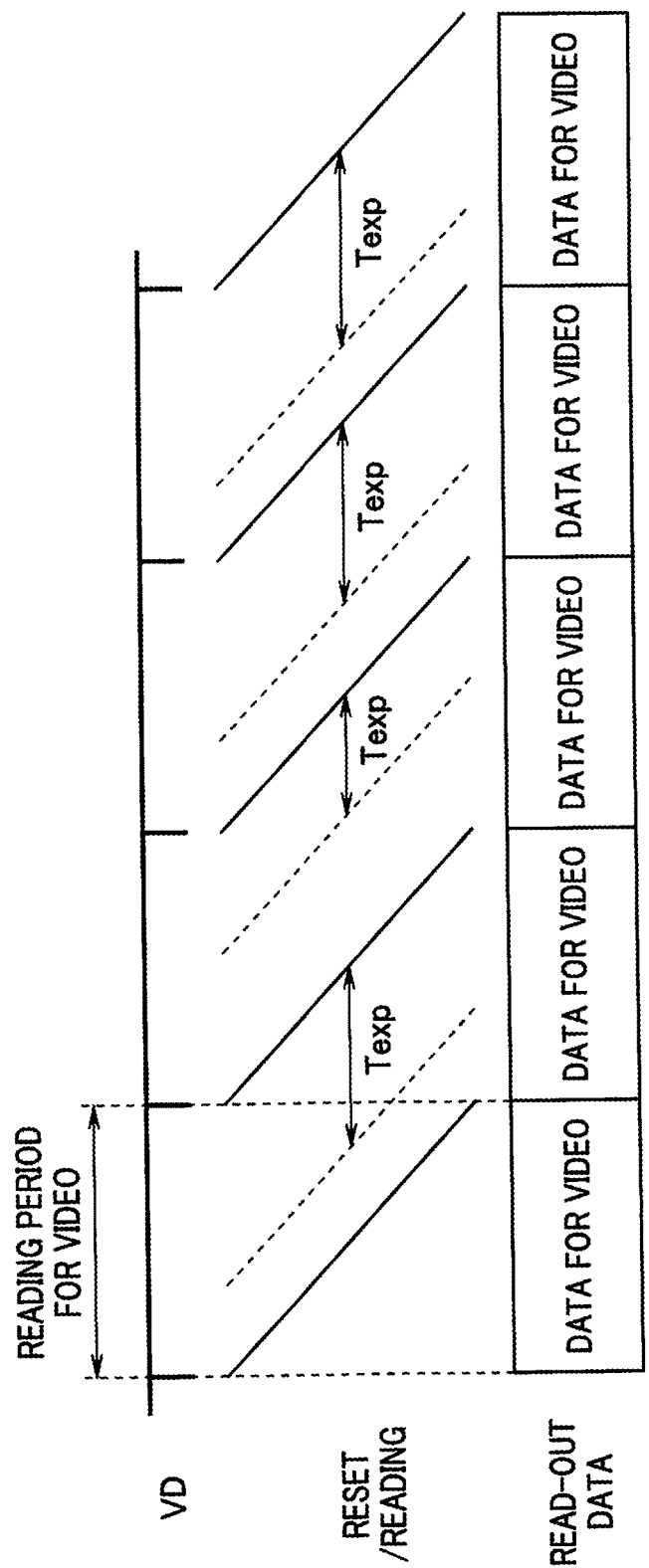
FIG. 18 is a timing chart showing reset/reading of the image sensor and readout data when data for video are read out on a frame basis in the first embodiment.

Next, FIG. 18 is a timing chart showing reset/reading of the image sensor 2 and read-out data when data for video is read out on a frame basis. Note that in FIG. 18 (and FIG. 19 described later), image data is continuously acquired on a frame basis, and image data is referred to as data for video in order to recall a movie, a live view image, and the like.

In the reset/reading of FIG. 18 (and FIG. 19 described later), solid diagonal lines represent reading in a direction from the first row to the last row, and dotted diagonal lines represent reset in the direction from the first row to the last row.

In synchronization with the vertical synchronization signal VD, the image sensor 2 starts reading of the divisional pixel signals (a reading time is an exposure end time). Therefore, the termination of reset of each pixel (a reset end time is an exposure start time) is performed at the time point when an exposure time Texp goes back from the reading. As a result, the divisional pixel signal to be read out is a signal obtained by performing exposure for the exposure time Texp.

As described above, the data for video are read out from the image sensor 2 on a frame basis in synchronization with the vertical synchronization signal VD. Note that when it is not necessary to read out all pixels (for example, when reading at a high frame rate is necessary), the image sensor 2 performs decimation reading, mix reading or the like as appropriate.

An example of a rolling shutter operation as an electronic shutter by the image sensor 2 has been shown, and for example, when a still image is captured, an operation of opening and closing a mechanical shutter (not shown) to capture one image is performed.

Figure 19:
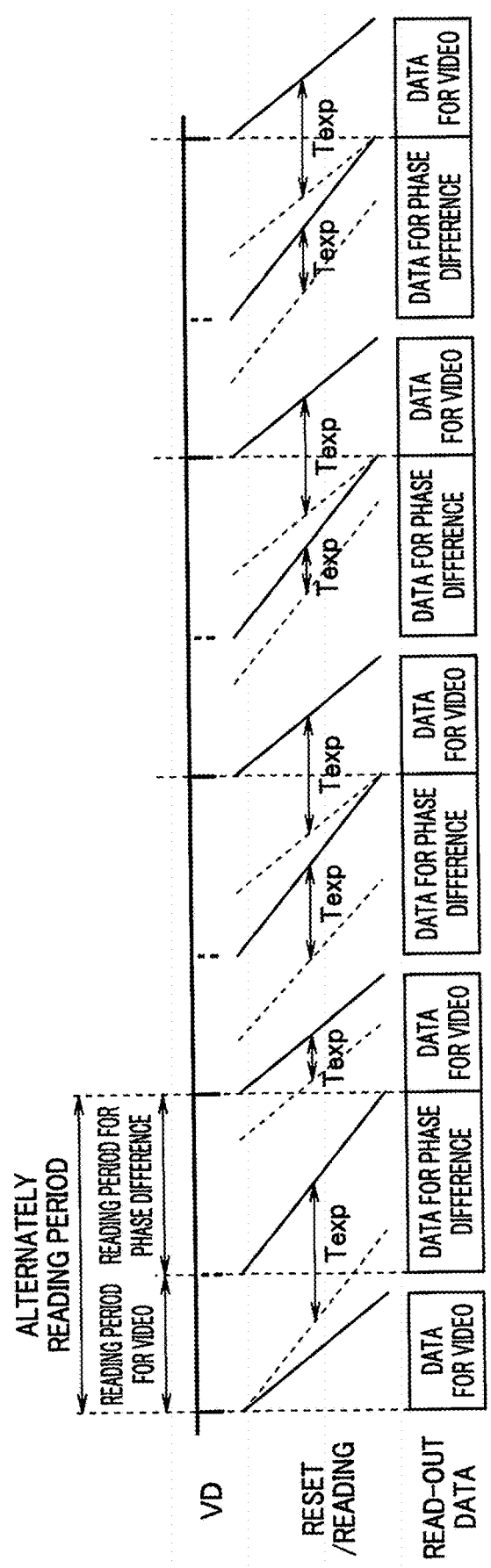
FIG. 19 is a timing chart showing reset/reading of the image sensor and readout data when data for video and data for phase difference are alternately read out in the first embodiment.

FIG. 19 is a timing chart showing reset/reading of the image sensor 2 and readout data when data for video and data for phase difference are alternately read out.

The data for video can be read out as pixel signals by adding the data for video with divisional pixel signals by the reading circuit as shown in FIG. 3 in the image sensor 2. On the other hand, with respect to the data for phase difference, it is necessary to read out the divisional pixel signals, so that the number of signals to be read out increases as compared with the data for video, for example. As a result, the time required to read out data for video from the image sensor 2 and the time required to read out data for phase difference from the image sensor 2 are generally different from each other.

Therefore, two types of vertical synchronization signals VD are generated when the data for video and the data for phase difference are alternately read out. For example, a time period from a vertical synchronization signal VD indicating a start timing of a video reading period for reading data for video to a vertical synchronization signal VD indicating a start timing of a next video reading period is defined as an alternate reading period. At this time, a first vertical synchronizing signal VD indicates the start timing of the video reading period (and the alternate reading period). Furthermore, a second vertical synchronization signal VD indicates the start timing of the phase difference reading period for reading out the data for phase difference (an end timing of the video reading period) within the alternate reading period.

According to the number of signals to be read, for example, the first vertical synchronization signal VD and the second vertical synchronization signal VD are generated so that the phase difference reading period is longer than the video reading period.

In this case, the absolute values of the gradients of the dotted diagonal lines and the solid diagonal lines indicating the reset end timing and the reading timing are larger in the data for video than the absolute values in the data for phase difference.

For both the data for video and the data for phase difference, the time point at which the exposure time Texp goes back from the reading timing indicated by the solid diagonal lines is the reset end timing as in the case of FIG. 18.

By performing such processing, the data for video and the data for phase difference are alternately read out. Here, as described above, not only the data for phase difference, but also the data for video can be read out as data containing phase difference information from the image sensor 2. In other words, when the data for video is read out as shown in FIG. 18, various kinds of processing for video and phase difference detection can be performed by reading out, from the image sensor 2, the data for video which has contained phase difference information, as described above.

On the other hand, as shown in FIG. 19, the difference between the data for video and the data for phase difference when the data for video and the data for phase difference are read out from the image sensor 2 lies in that the data for video is data prioritizing the quality of video, and the data for phase difference is data prioritizing the accuracy of phase difference detection. In other words, the data for video is subjected to vertical mixing or horizontal mixing in the image sensor 2 in consideration of the quality of video. The data for phase difference is subjected to vertical mixing or horizontal mixing in the image sensor 2 in consideration of the accuracy of phase difference detection. Furthermore, as described with reference to FIG. 3, in the pixel divisional configuration of RLUD division, reading of RL-division and UD-division can be selectively performed, and pixels read out in RL-division enable phase difference detection in the horizontal direction (vertical line detection), and pixels read out in UD-division enable phase difference detection in the vertical direction (horizontal line detection).

By performing reading as shown in FIG. 19, it is possible to perform reading with both the quality of video and the accuracy of phase difference detection optimized, and by additionally performing the phase difference detection for both data for video data and data for phase difference, advanced phase difference detection can be realized. The operation shown in FIG. 19 is mainly used when it is desired to enhance the accuracy of phase difference detection during live view.

Note that it is the same as described above that a high frame rate is ensured by appropriately performing decimation reading, mix reading or the like as necessary.

In the foregoing description, the configuration example in which all the image data generation circuit 11, the second image processing circuit 12, the memory 13, and the image processing circuit 14 are included in the image processing device 3 has been described. However, the present invention is not limited to this configuration, and may include a configuration in which at least some of the circuits are included in the image sensor 2. As an example, the image data generation circuit 11 (or a part of the configuration in the image data generation circuit 11 shown in FIG. 2) may be provided in the image sensor 2.

According to the first embodiment, since a plurality of Bayer-type divisional image data configured by divisional pixel signals having the same divisional arrangement are generated from divisional pixel signals, the image processing circuit 14 can also perform the image processing for Bayer-type normal image data (normal RAW image data) on a plurality of Bayer-type divisional image data. Accordingly, the image processing circuit 14 can perform the image processing on a plurality of Bayer-type divisional image data while using an existing processing circuit without adding a dedicated processing circuit.

Since the image data generation circuit 11 includes the rearrangement circuit 20 configured to rearrange the divisional pixel signals outputted from the image sensor 2 in an order suitable for the processing of the processing circuit for image generation 21, the processing circuit for image generation 21 can process the divisional pixel signals in the same order even when the image sensor 2 is a sensor that outputs the divisional pixel signal in any order.

Furthermore, since the Bayer separation circuit 29 is provided, the rearranged image data processed by the processing circuit for image generation 21 can be separated into n pieces of Bayer-type divisional image data and stored in the memory 13.

Since the processing circuit for image generation 21 includes at least one of the first circuit, the second circuit, and the third circuit, it is possible to perform necessary processing which is adapted to whether the divisional arrangements are discriminated or not and whether the filter colors are discriminated or not.

Since the first circuit includes at least one of the OB detection circuit 23 and the defect correction circuit 28, at least one of the OB detection processing and the defect correction processing can be performed at high speed based on the rearranged image data.

Since the second circuit includes at least one of the low-light shading correction circuit 22, the sensitivity correction circuit 25, the linearity correction circuit 26, and the lens shading correction circuit 27, at least one of the low-light shading correction, the sensitivity correction, the linearity correction, and the lens shading correction can be performed at high speed based on the rearranged image data.

Since the third circuit includes the horizontal streak correction circuit 24, the horizontal streak noise signal component can be removed at high speed based on the rearranged image data.

The second image processing circuit 12 having the phase difference mix circuit 32 configured to generate one piece of Bayer-type normal image data configured by pixel signals from rearranged image data configured by divisional pixel signals, is provided. Therefore, it is possible to perform processing on Bayer-type normal image data at high speed.

Since the second image processing circuit 12 includes at least one of the exposure level detection circuit 34, the contrast detection circuit 35, and the resizing circuit 33 as a circuit configured to process the Bayer-type normal image data, at least one of exposure level detection, contrast detection, and resizing can be performed by using a circuit similar to the conventional circuit.

Since the image processing circuit 14 includes at least one of the low-light image correction circuit 42, the combining circuit 41, and the RAW compression and decompression filing circuit 46, it is possible to perform at least one of low-light image correction, synthesis for generating one piece of Bayer-type normal image data from a plurality of divisional pixel data, RAW compression, and filing. When the image processing circuit 14 includes all of the low-light image correction circuit 42, the combining circuit 41, and the RAW compression and decompression filing circuit 46, normal RAW image data can be generated from the divisional RAW image data, and redevelopment processing can be performed.

Since the image processing circuit 14 further includes the recording and reading circuit 47, one file (divisional RAW image file) including a plurality of divisional RAW image data can be recorded in the recording medium 5. As a result, it is possible to bring a special image quality effect by performing image processing including redevelopment in the image pickup apparatus, an external PC (personal computer) or the like.

A file recorded on the recording medium 5 is read out by the recording and reading circuit 47, a plurality of Bayer-type divisional image data are restored by the RAW compression and decompression filing circuit 46, and one piece of Bayer-type normal image data is generated by the combining circuit 41, so that generation of normal RAW image data and redevelopment processing can be performed. Here, it is also possible to perform re-movie processing from a plurality of Bayer-type divisional image data that are temporally sequential.

Since the image processing circuit 14 further includes the image basic processing circuit 43, it is possible to generate a still image or a movie from the normal RAW image data. It is also possible to generate a still image different from a still image under photographing by redevelopment.

Since the image data generation circuit 11 is provided on an upstream side of the memory 13 and the image processing circuit 14 is provided on a downstream side of the memory 13, the image data generation circuit 11 can process the divisional pixel signals outputted from the image sensor 2 in proportion to the output speed according to the output order, and can perform image processing in an appropriate order.

Furthermore, since the phase difference detection circuit 31 configured to detect phase difference information based on rearranged image data processed by the processing circuit for image generation 21 is provided, the phase difference information can be detected at high speed, and the image plane phase difference AF can be performed.

In this way, according to the image pickup apparatus and the image processing device 3 of the present embodiment, the preprocessing before the basic image processing is performed can be performed without reducing the processing speed while reducing the circuit change from the conventional circuit, and it is also possible to perform image processing similar to the conventional image processing.

By performing the alternate reading as shown in FIG. 19, it is possible to acquire the phase difference information when a movie or a live view image is acquired on a frame basis.

According to the image pickup apparatus and the image processing device 3 of the present embodiment, a plurality of divisional pixel signals generated by the image sensor 2 in which a plurality of photoelectric conversion units are included in one pixel are can be processed to be recordable without greatly influencing an existing circuit.

Note that the processing of each unit described above may be performed by one or more processors configured as hardware. For example, each unit may be a processor configured as an electronic circuit, or may be each circuit unit in a processor configured by an integrated circuit such as an FPGA (field programmable gate array). Alternatively, a processor configured by one or more CPUs may execute the functions as the respective units by reading and executing processing programs recorded in the recording medium.

In the above description, the image processing device and the image pickup apparatus have been mainly described. However, a control method for controlling the image processing device and the image pickup apparatus as described above may be applied, or a computer-readable non-transitory recording medium, etc. in which processing programs for causing a computer to execute processing similar to the processing of the image processing device and the image pickup apparatus are recorded may be applied.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. An image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more, the image processing device being configured to process divisional pixel signals of m×n generated by the photoelectric conversion elements of m×n, and comprising:

an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data, wherein the image data generation circuit comprises:

an image generation processing circuit configured to process the divisional pixel signals outputted from the image sensor; and a Bayer separation circuit configured to separate the divisional pixel signals processed by the image generation processing circuit into the n pieces of Bayer-type divisional image data, wherein the image generation processing circuit comprising:

at least one of a first circuit configured to process the divisional pixel signals while discriminating the divisional arrangements and the filter colors;

a second circuit configured to process the divisional pixel signals while discriminating the filter colors without discriminating the divisional arrangements; and a third circuit configured to process the divisional pixel signals while discriminating neither the divisional arrangements nor the filter colors.

2. The image processing device according to claim 1, wherein the image sensor includes pixels that are not light-shielded, and OB pixels that are light-shielded pixels, and the first circuit comprises:

at least one of an OB detection circuit configured to calculate OB divisional pixel signals of n for which the divisional arrangement is discriminated, based on the divisional pixel signals of n generated by an OB pixel; and a defect correction circuit configured to correct a divisional pixel signal generated by a defective photoelectric conversion element included in the image sensor based on divisional pixel signals generated by photoelectric conversion elements that are normal photoelectric conversion elements located around the defective photoelectric conversion element and have a same divisional arrangement and a same filter color.

3. The image processing device according to claim 1, wherein the second circuit comprises:

at least one of a low-light shading correction circuit configured to perform subtraction processing on the divisional pixel signals and low-light shading data corresponding to pixels containing the photoelectric conversion elements generating the divisional pixel signals based on low-light shading data corresponding to an arrangement of the pixels, thereby performing low-light shading correction while discriminating the filter colors without discriminating the divisional arrangements;

a sensitivity correction circuit configured to perform sensitivity correction on the divisional pixel signals while discriminating the filter colors without discriminating the divisional arrangements;

a linearity correction circuit configured to perform linearity correction on the divisional pixel signals while discriminating the filter colors without discriminating the divisional arrangements; and a lens shading correction circuit configured to perform lens shading correction on the divisional pixel signals based on lens shading data corresponding to an arrangement of the pixels while discriminating the filter colors without discriminating the divisional arrangements.

4. The image processing device according to claim 1, wherein the image sensor includes pixels that are not light-shielded, and OB pixels that are light-shielded pixels, and the third circuit includes a horizontal streak correction circuit configured to detect a horizontal streak noise signal generated by the OB pixels, and perform a correction of removing a component of the horizontal streak noise signal generated by pixels on a same row as the OB pixels.

5. An image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more, the image processing device being configured to process divisional pixel signals of m×n generated by the photoelectric conversion elements of m×n, and comprising:

an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data, wherein the image data generation circuit comprises:

an image generation processing circuit configured to process the divisional pixel signals outputted from the image sensor; and a Bayer separation circuit configured to separate the divisional pixel signals processed by the image generation processing circuit into the n pieces of Bayer-type divisional image data, further comprising a second image processing circuit including a phase difference mix circuit configured to add the divisional pixel signals of n generated by the pixel to the divisional pixel signals processed by the image generation processing circuit to generate a pixel signal, thereby generating one piece of Bayer-type normal image data.

6. The image processing device according to claim 5, wherein the second image processing circuit comprises a resizing circuit configured to perform resizing processing on the Bayer-type normal image data as a circuit configured to process the Bayer-type normal image data generated by the phase difference mix circuit, and processing of the Bayer separation circuit, processing of the phase difference mix circuit, and processing of the resizing circuit are executed in parallel to generate the n pieces of Bayer-type divisional image data, the one piece of Bayer-type normal image data, and resized image data of a normal image.

7. The image processing device according to claim 5, wherein the second image processing circuit comprises, as a circuit configured to process the Bayer-type normal image data generated by the phase difference mix circuit, at least one of an exposure level detection circuit configured to detect an exposure level for controlling exposure of the image sensor based on the Bayer-type normal image data, a contrast detection circuit configured to detect contrast of the Bayer-type normal image data, and a resizing circuit configured to perform resizing processing on the Bayer-type normal image data.

8. An image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more, the image processing device being configured to process divisional pixel signals of m×n generated by the photoelectric conversion elements of m×n, and comprising:

an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data, wherein the image processing circuit comprises:

at least one of a low-light image correction circuit in which with respect to the n pieces of Bayer-type divisional image data and n pieces of Bayer-type low-light divisional image data generated while the image sensor is light-shielded, processing of subtracting the low-light divisional image data from the divisional image data to which the divisional arrangements correspond to, is executed for each pixel position with respect to each of the divisional arrangements, thereby performing low-light correction;

a combining circuit configured to add the divisional pixel signals of n generated by the pixel to the n pieces of Bayer-type divisional image data to generate a pixel signal, thereby generating one Bayer-type normal image data configured by the pixel signal;

a RAW compression circuit configured to compress each of the n pieces of Bayer-type divisional image data; and a filing circuit configured to generate one file containing the n pieces of Bayer-type divisional image data.

9. The image processing device according to claim 8, wherein the image processing circuit further comprises a recording circuit configured to record the file generated by the filing circuit into a recording medium.

10. The image processing device according to claim 9, wherein the image processing circuit further comprises a reading circuit configured to read the file recorded in the recording medium, the filing circuit restores the n pieces of Bayer-type divisional image data from the file read out by the reading circuit, and the combining circuit adds the divisional pixel signals of n generated by the pixel to the n pieces of Bayer-type divisional image data restored by the filing circuit to generate a pixel signal, thereby generating one piece of Bayer-type normal image data configured by the pixel signal.

11. The image processing device according to claim 8, wherein the image processing circuit further comprises an image basic processing circuit configured to perform demosaicking processing, noise cancel processing, gamma conversion processing, white balance processing, color matrix processing, and edge processing on the Bayer-type normal image data.

12. An image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more, the image processing device being configured to process divisional pixel signals of m×n generated by the photoelectric conversion elements of m×n, and comprising:

an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data,
wherein the image data generation circuit comprises:
an image generation processing circuit configured to process the divisional pixel signals outputted from the image sensor; and
a Bayer separation circuit configured to separate the divisional pixel signals processed by the image generation processing circuit into the n pieces of Bayer-type divisional image data,
further comprising a memory, wherein the Bayer separation circuit generates the n pieces of Bayer-type divisional image data and outputs the generated divisional image data to the memory, the memory stores therein the n pieces of Bayer-type divisional image data generated by the image data generation circuit, and the image processing circuit reads out the n pieces of Bayer-type divisional image data from the memory and performs image processing in an order suitable for the image processing circuit.

13. The image processing device according to claim 12, further comprising a phase difference mix circuit configured to add the divisional pixel signals of n generated by the pixel to the divisional pixel signals processed by the image generation processing circuit to generate a pixel signal, thereby generating one piece of Bayer-type normal image data configured by the pixel signal, wherein the memory stores the n pieces of Bayer-type divisional image data generated by the Bayer separation circuit and the one piece of Bayer-type normal image data generated by the phase difference mix circuit, and the image processing circuit reads out the n pieces of Bayer-type divisional image data and the one piece of Bayer-type normal image data from the memory, and performs image processing in an appropriate order.

14. The image processing device according to claim 13, further comprising a resizing circuit configured to perform resizing processing on the one piece of Bayer-type normal image data to generate resized image data of a normal image as a circuit configured to perform processing on the one piece of Bayer-type normal image data generated by the phase difference mix circuit, wherein the memory stores therein the n pieces of Bayer-type divisional image data generated by the Bayer separation circuit and the resized image data of the normal image generated by the resizing circuit, and the image processing circuit reads out the n pieces of Bayer-type divisional image data and the resized image data of the normal image from the memory, and performs image processing in an appropriate order.

15. An image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more,
the image processing device being configured to process divisional pixel signals of m×n generated by the photoelectric conversion elements of m×n, and comprising:
an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and
an image processing circuit configured to perform image processing on the n pieces of Bayer-type divisional image data,
wherein the image data generation circuit comprises:
an image generation processing circuit configured to process the divisional pixel signals outputted from the image sensor; and
a Bayer separation circuit configured to separate the divisional pixel signals processed by the image generation processing circuit into the n pieces of Bayer-type divisional image data,
further comprising a phase difference detection circuit configured to detect phase difference information based on the divisional pixel signals processed by the image generation processing circuit.

16. An image processing device for an image sensor including color filters of m in which a plurality of filter colors are arranged in a Bayer layout, microlenses of m each of which is provided so as to correspond to each of the color filters of m, and photoelectric conversion elements of m sets each of which is provided so as to correspond to each of the microlenses of m so that a pixel including one color filter and one microlens further includes a set comprising photoelectric conversion elements of n, wherein m represents an integer of 4 or more and n represents an integer of 2 or more,
the image processing device being configured to process divisional pixel signals of m×n generated by the photoelectric conversion elements of m×n, and comprising:
an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and
an image processing circuit configured to perform image processing on the n pieces of Bayer-type divisional image data,
wherein the image data generation circuit comprises:
an image generation processing circuit configured to process the divisional pixel signals outputted from the image sensor; and
a Bayer separation circuit configured to separate the divisional pixel signals processed by the image generation processing circuit into the n pieces of Bayer-type divisional image data,
wherein the image data generation circuit comprises a rearrangement circuit configured to rearrange the divisional pixel signals outputted from the image sensor in an order suitable for processing on a subsequent stage in the image data generation circuit to generate rearranged image data, and the rearrangement circuit outputs the divisional pixel signals of the rearranged image data to the image generation processing circuit.

17. An image pickup apparatus comprising:
an image sensor including:
color filters of m in which a plurality of filter colors are arranged in a Bayer layout, wherein m represents an integer of 4 or more;
microlenses of m each of which is provided so as to correspond to each of the color filters of m;
photoelectric conversion elements of m×n that include photoelectric conversion elements of m sets each of which is provided so as to correspond to each of the microlenses of m so that a pixel including one color filter and one microlens further includes a set comprising photoelectric conversion elements of n, and generate divisional pixel signals of m×n respectively, wherein n represents an integer of 2 or more; and an image data generation circuit configured to generate n pieces of Bayer-type divisional image data configured by divisional pixel signals having a same divisional arrangement from the divisional pixel signals of m×n, wherein an arrangement of the photoelectric conversion elements of n for the one microlens is defined as a divisional arrangement; and an image processing circuit configured to perform image processing on the n pieces of Bayer-type divisional image data outputted from the image sensor, the image processing circuit including at least one of a low-light image correction circuit in which with respect to the n pieces of Bayer-type divisional image data and n pieces of Bayer-type low-light divisional image data generated while the image sensor is light-shielded, processing of subtracting the low-light divisional image data from the divisional image data to which the divisional arrangements correspond to, is executed for each pixel position with respect to each of the divisional arrangements, thereby performing low-light correction, a combining circuit configured to add the divisional pixel signals of n generated by the pixel to the n pieces of Bayer-type divisional image data to generate a pixel signal, thereby generating one Bayer-type normal image data configured by the pixel signal, a RAW compression circuit configured to compress each of the n pieces of Bayer-type divisional image data, and a filing circuit configured to generate one file containing the n pieces of Bayer-type divisional image data.

* * * * *